(12) United States Patent
Yamazaki

(10) Patent No.: US 10,249,764 B2
(45) Date of Patent: Apr. 2, 2019

(54) SEMICONDUCTOR DEVICE, DISPLAY DEVICE INCLUDING SEMICONDUCTOR DEVICE, ELECTRONIC DEVICE INCLUDING SEMICONDUCTOR DEVICE, AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 40 days.

(21) Appl. No.: 15/669,275

(22) Filed: Aug. 4, 2017

(65) Prior Publication Data

US 2017/0338352 A1 Nov. 23, 2017

Related U.S. Application Data

(62) Division of application No. 13/755,397, filed on Jan. 31, 2013, now abandoned.

(30) Foreign Application Priority Data

Feb. 9, 2012 (JP) .................................. 2012-026624

(51) Int. Cl.
*H01L 29/786* (2006.01)
*H01L 29/66* (2006.01)
(Continued)

(52) U.S. Cl.
CPC ........ *H01L 29/78681* (2013.01); *H01L 29/45* (2013.01); *H01L 29/4908* (2013.01);
(Continued)

(58) Field of Classification Search
CPC .......... H01L 29/78681; H01L 29/7869; H01L 29/45; H01L 29/4908; H01L 21/76841;
(Continued)

(56) References Cited

U.S. PATENT DOCUMENTS 4,388,351 A 6/1983 Sawyer
5,266,516 A 11/1993 Ho
(Continued)

FOREIGN PATENT DOCUMENTS

EP 0260906 A 3/1988
EP 1063693 A 12/2000
(Continued)

OTHER PUBLICATIONS

Hu.C et al., "Comparison of Cu electromigration lifetime in Cu interconnects coated with various caps", Appl. Phys. Lett. (Applied Physics Letters) , Aug. 4, 2003, vol. 83, No. 5, pp. 869-871.
(Continued)

*Primary Examiner* — Matthew Landau
*Assistant Examiner* — Mark Hatzilambrou
(74) *Attorney, Agent, or Firm* — Robinson Intellectual Property Law Office; Eric J. Robinson

(57) ABSTRACT

A method for manufacturing a transistor with stable electric characteristics and little signal delay due to wiring resistance, used in a semiconductor device including an oxide semiconductor film. A semiconductor device including the transistor is provided. A high-performance display device including the transistor is provided.

19 Claims, 13 Drawing Sheets

(51) Int. Cl.
*H01L 29/45* (2006.01)
*H01L 29/49* (2006.01)

(52) U.S. Cl.
CPC .. *H01L 29/66742* (2013.01); *H01L 29/66969* (2013.01); *H01L 29/7869* (2013.01)

(58) Field of Classification Search
CPC ........... H01L 21/7685; H01L 21/76852; H01L 2221/1073; H01L 2221/1078; H01L 23/53223; H01L 23/53238; H01L 29/66969; H01L 21/76865; H01L 21/76895
USPC .......................................................... 257/43
See application file for complete search history.

(56) References Cited

U.S. PATENT DOCUMENTS

| | | | |
|---|---|---|---|
| 5,510,298 A | 4/1996 | Redwine | |
| 5,550,405 A | 8/1996 | Cheung et al. | |
| 5,679,608 A | 10/1997 | Cheung et al. | |
| 5,731,856 A | 3/1998 | Kim et al. | |
| 5,744,864 A | 4/1998 | Cillessen et al. | |
| 5,943,105 A | 8/1999 | Fujikawa et al. | |
| 5,965,934 A | 10/1999 | Cheung et al. | |
| 6,218,257 B1 | 4/2001 | Kita | |
| 6,294,274 B1 | 9/2001 | Kawazoe et al. | |
| 6,297,519 B1 | 10/2001 | Fujikawa et al. | |
| 6,469,317 B1 | 10/2002 | Yamazaki et al. | |
| 6,495,709 B1 | 12/2002 | Celinska et al. | |
| 6,501,098 B2 | 12/2002 | Yamazaki | |
| 6,512,271 B1 | 1/2003 | Yamazaki et al. | |
| 6,518,594 B1 | 2/2003 | Nakajima et al. | |
| 6,524,895 B2 | 2/2003 | Yamazaki et al. | |
| 6,563,174 B2 | 5/2003 | Kawasaki et al. | |
| 6,570,552 B2 | 5/2003 | Yamazaki | |
| 6,617,644 B1 | 9/2003 | Yamazaki et al. | |
| 6,727,522 B1 | 4/2004 | Kawasaki et al. | |
| 6,747,288 B2 | 6/2004 | Yamazaki et al. | |
| 6,876,406 B2 | 4/2005 | Hwang | |
| 6,891,270 B2 | 5/2005 | Sugawara et al. | |
| 6,956,236 B1 | 10/2005 | Sasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,202,155 B2 | 4/2007 | Fukuchi | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,358,183 B2 | 4/2008 | Fukuchi | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,626,125 B2 | 12/2009 | Nakamura | |
| 7,674,650 B2 | 3/2010 | Akimoto et al. | |
| 7,732,819 B2 | 6/2010 | Akimoto et al. | |
| 7,776,712 B2 | 8/2010 | Yamazaki et al. | |
| 7,804,174 B2 | 9/2010 | Sasaki et al. | |
| 7,910,490 B2 | 3/2011 | Akimoto et al. | |
| 8,110,748 B2 | 2/2012 | Nakamura | |
| 8,299,461 B2 | 10/2012 | Tanaka et al. | |
| 8,410,002 B2 | 4/2013 | Yamazaki et al. | |
| 8,471,256 B2 | 6/2013 | Yamazaki et al. | |
| 8,692,252 B2 | 4/2014 | Takata et al. | |
| 8,742,544 B2 | 6/2014 | Yamazaki et al. | |
| 8,828,811 B2 | 9/2014 | Yamazaki | |
| 8,866,140 B2 | 10/2014 | Koike et al. | |
| 9,024,311 B2 | 5/2015 | Hara et al. | |
| 9,219,162 B2 | 12/2015 | Yamazaki et al. | |
| 9,373,707 B2 | 6/2016 | Yamazaki | |
| 2001/0025960 A1 | 10/2001 | Ohtani et al. | |
| 2001/0046027 A1 | 11/2001 | Tai et al. | |
| 2002/0056838 A1 | 5/2002 | Ogawa | |
| 2002/0085157 A1 | 7/2002 | Tanaka et al. | |
| 2002/0132454 A1 | 9/2002 | Ohtsu et al. | |
| 2002/0139980 A1 | 10/2002 | Yamazaki | |
| 2003/0090002 A1* | 5/2003 | Sugawara ........... | H01L 21/2885 257/784 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0185683 A1 | 9/2004 | Nakamura | |
| 2004/0263746 A1 | 12/2004 | Cho et al. | |
| 2005/0017302 A1 | 1/2005 | Hoffman | |
| 2005/0199959 A1 | 9/2005 | Chiang et al. | |
| 2005/0263769 A1 | 12/2005 | Chul Ahn | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0166411 A1 | 7/2006 | Morisue et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0102818 A1* | 5/2007 | Sasaki ............... | G02F 1/136286 257/751 |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0044647 A1 | 2/2008 | Nishibayashi et al. | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |

(56) References Cited

U.S. PATENT DOCUMENTS

| | | |
|---|---|---|
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1* | 2/2010 | Yamazaki ............ H01L 27/1225 257/43 |
| 2010/0032708 A1 | 2/2010 | Fujikawa et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0314618 A1 | 12/2010 | Tanaka et al. |
| 2011/0062436 A1 | 3/2011 | Yamazaki et al. |
| 2011/0127524 A1 | 6/2011 | Yamazaki et al. |
| 2011/0133177 A1* | 6/2011 | Suzawa ............... H01L 27/1225 257/43 |
| 2011/0286256 A1 | 11/2011 | Kamata |
| 2012/0206685 A1 | 8/2012 | Takasawa et al. |
| 2012/0256179 A1 | 10/2012 | Yamazaki et al. |
| 2013/0112972 A1 | 5/2013 | Koike et al. |
| 2013/0248854 A1 | 9/2013 | Yamazaki et al. |
| 2014/0021466 A1 | 1/2014 | Yamazaki et al. |
| 2014/0370656 A1 | 12/2014 | Yamazaki |
| 2016/0111552 A1 | 4/2016 | Yamazaki et al. |

FOREIGN PATENT DOCUMENTS

| | | |
|---|---|---|
| EP | 1737044 A | 12/2006 |
| EP | 2226847 A | 9/2010 |
| EP | 2544237 A | 1/2013 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-027125 A | 1/1992 |
| JP | 05-066421 A | 3/1993 |
| JP | 05-251705 A | 9/1993 |
| JP | 06-082820 A | 3/1994 |
| JP | 08-146463 A | 6/1996 |
| JP | 08-264794 A | 10/1996 |
| JP | 08-297291 A | 11/1996 |
| JP | 11-026475 A | 1/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-282788 A | 10/2003 |
| JP | 2004-103605 A | 4/2004 |
| JP | 2004-103957 A | 4/2004 |
| JP | 2004-273614 A | 9/2004 |
| JP | 2004-273732 A | 9/2004 |
| JP | 2004-304167 A | 10/2004 |
| JP | 2007-096055 A | 4/2007 |
| JP | 2007-123861 A | 5/2007 |
| JP | 4247772 | 4/2009 |
| JP | 2010-073881 A | 4/2010 |
| JP | 2010-230965 A | 10/2010 |
| JP | 2010-287735 A | 12/2010 |
| JP | 2011-086923 A | 4/2011 |
| JP | 2011-124360 A | 6/2011 |
| JP | 2011-124556 A | 6/2011 |
| JP | 2011-135061 A | 7/2011 |
| JP | 2011-243972 A | 12/2011 |
| WO | WO-2000/036641 | 6/2000 |
| WO | WO-2004/114391 | 12/2004 |
| WO | WO-2010/150446 | 12/2010 |
| WO | WO-2011/024770 | 3/2011 |
| WO | WO-2011/033936 | 3/2011 |
| WO | WO-2011/058866 | 5/2011 |
| WO | WO-2011/065208 | 6/2011 |
| WO | WO-2011/132548 | 10/2011 |
| WO | WO-2012/002574 | 1/2012 |

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m= 3, 4, and 5), $InGaO_3(ZnO)_3$, and $Ga_2O_3(ZnO)m$ (m= 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Applications", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

* cited by examiner

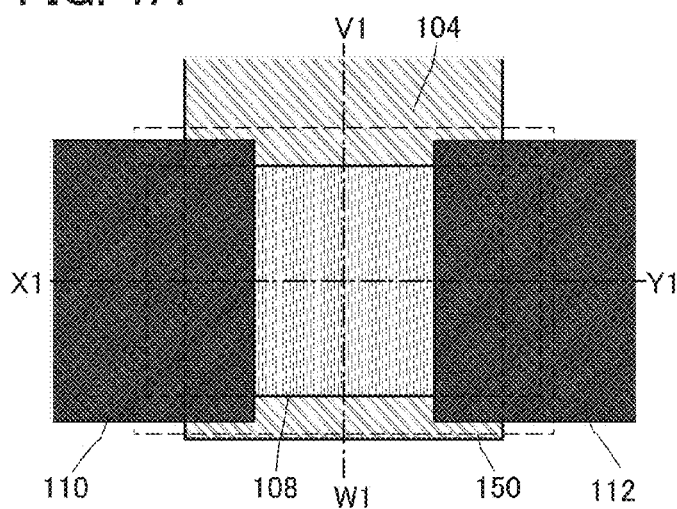
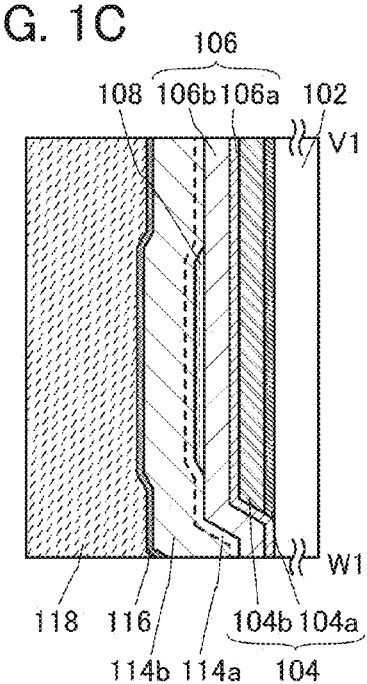
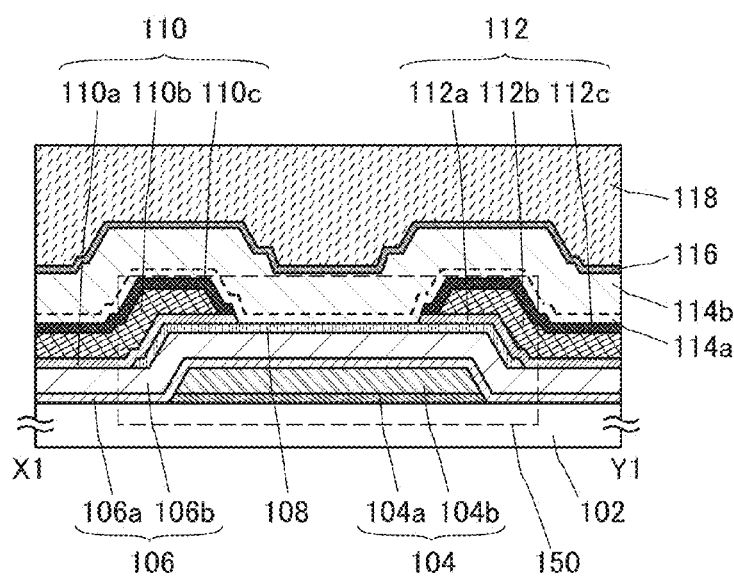

FIG. 13A    FIG. 13B   FIG. 13C
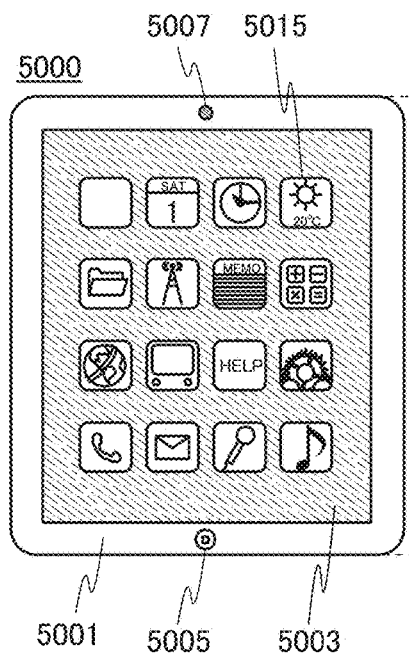
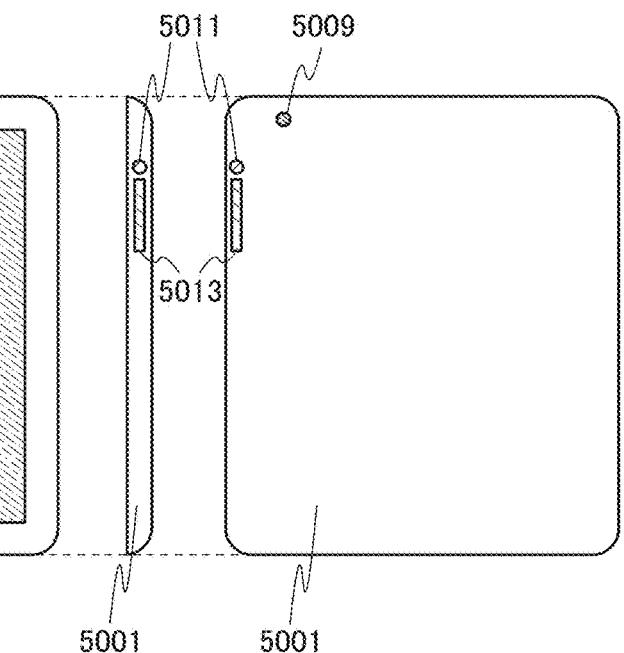
FIG. 13D
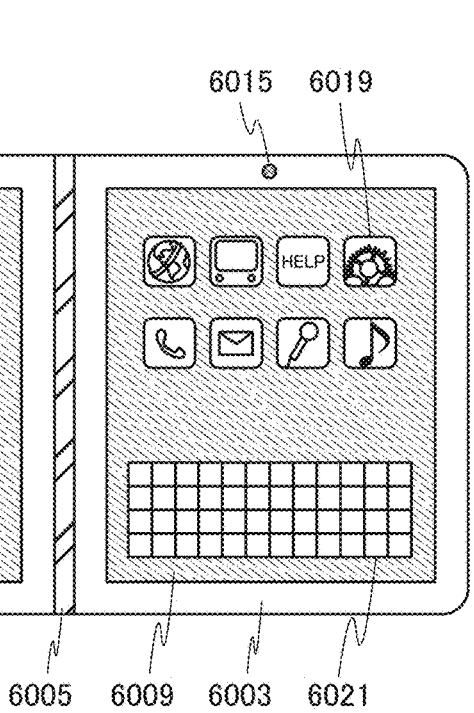

SEMICONDUCTOR DEVICE, DISPLAY DEVICE INCLUDING SEMICONDUCTOR DEVICE, ELECTRONIC DEVICE INCLUDING SEMICONDUCTOR DEVICE, AND METHOD FOR MANUFACTURING SEMICONDUCTOR DEVICE

BACKGROUND OF THE INVENTION

1. Field of the Invention

The present invention relates to semiconductor devices and methods for manufacturing the same. Further, the present invention relates to display devices and electronic devices having the semiconductor devices.

2. Description of the Related Art

Attention has been focused on a technique for forming a transistor using a semiconductor thin film formed over a substrate having an insulating surface (also referred to as thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a technique in which a transistor is manufactured using a Zn—O-based oxide or an In—Ga—Zn—O-based oxide as an oxide semiconductor is disclosed (see Patent Documents 1 and 2).

Moreover, there is a trend in a display device using a transistor (e.g., a liquid crystal panel and an organic EL panel) toward a larger screen. As the screen size becomes larger, in the case of a display device using an active element such as a transistor, a voltage applied to an element varies depending on the position of a wiring which is connected to the element due to wiring resistance, which cause a problem of deterioration of display quality such as display unevenness and a defect in grayscale.

In addition, a trend in resolution of a screen of the display device is toward higher definition, e.g., high-definition (HD) image quality (1366×768) or full high-definition (FHD) image quality (1920×1080), and prompt development of a 4K Digital Cinema display device, which has a resolution of 3840×2048 or 4096×2180, is also demanded.

As the resolution of the screen of the display device is improved, a driving frequency used for a driver circuit and the like in the display device tends to be increased; thus, application of a low resistance material with little signal delay to a wiring, a signal line, or the like is desired.

Conventionally, an aluminum film has been widely used as a material used for the wiring, the signal line, or the like; moreover, research and development of using a copper film as a material is extensively conducted to further reduce resistance. However, a copper film is disadvantageous in that adhesion thereof to a base film is low and that characteristics of a transistor easily deteriorates due to diffusion of a copper element in the copper film into a semiconductor layer of the transistor. Accordingly, in order to improve adhesion to the base film and to prevent diffusion of the copper element, a technique of manufacturing a transistor using a silicon nitride film, a copper alloy layer formed over the silicon nitride film, and a pure copper layer formed over the copper alloy layer is disclosed (see Patent Document 3).

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2010-230965

SUMMARY OF THE INVENTION

Patent Document 1 assumes a silicon-based semiconductor material as a material for a semiconductor thin film applicable to a transistor. Thus, there has been a problem in that the disclosed technique in Patent Document 1 is not a manufacturing method or a structure suitable for a transistor using an oxide semiconductor film in a channel formation region.

In view of the above problems, one object of one embodiment of the present invention is to provide a method for manufacturing a transistor with stable electric characteristics and little signal delay due to wiring resistance, used in a semiconductor device including an oxide semiconductor film. In addition, one object is to provide a semiconductor device including the transistor. Further, one object is to provide a high-performance display device including the transistor.

In a method for manufacturing a semiconductor device including a bottom-gate transistor using an oxide semiconductor film in a channel forming region, a source electrode and a drain electrode are formed in contact with the oxide semiconductor film. The source electrode and the drain electrode each include a first metal film, a second metal film, and a third metal film. The second metal film uses a material containing a copper element.

A method for forming the source electrode and the drain electrode in contact with the oxide semiconductor film includes the steps of: forming a first metal film and a second metal film, performing a first photolithography process on the second metal film, partly removing the second metal film by first etching, forming the third metal film over the first metal film and the second metal film, performing a second photolithography process on the third metal film, and partly removing the first metal film and the third metal film by second etching. The second etching partly removes the first metal film and the third metal film at an outer side of end portions of the second metal film which is removed by the first etching. Using such a manufacturing method, the second metal film is covered with (preferably, surrounded by) the first metal film and the third metal film; thus, a material containing a copper element used in the second metal can be prevented from diffusing into the oxide semiconductor film. Details thereof will be described below.

One embodiment of the present invention is a method for manufacturing a semiconductor device including the steps of: forming a gate electrode; forming a gate insulating film over the gate electrode; forming an oxide semiconductor film in contact with the gate insulating film and in a position overlapping with the gate electrode; and forming a source electrode and a drain electrode over the oxide semiconductor film. In order to form the source electrode and the drain electrode, following steps are included: forming a first metal film and a second metal film; performing a first photolithography process on the second metal film and partly removing the second metal film by first etching; forming a third metal film over the first metal film and the second metal film; and performing a second photolithography process on the third metal film and partly removing the first metal film and the third metal film by second etching. The second etching partly removes the first metal film and the third metal film at an outer side of end portions of the second metal film which is removed by the first etching.

The above method may further include the steps of: forming a first insulating film over the source electrode and the drain electrode; introducing oxygen into the first insulating film; forming a second insulating film over the first insulating film; forming an aluminum film over the second insulating film; introducing oxygen into the aluminum film to form an aluminum oxide film; and forming a planarization insulating film over the aluminum oxide film.

Further, in each of the above-described methods, the first metal film and the third metal film may each be a metal film or a metal nitride film containing one or more elements selected from tungsten, tantalum, titanium, and molybdenum. The second metal film may contain a copper element.

Further, in each of the above-described methods, the first etching may be a wet etching method and the second etching may be a dry etching method.

Further, another embodiment of the present invention is a semiconductor device including: a gate electrode; a gate insulating film over the gate electrode; an oxide semiconductor film in contact with the gate insulating film and in a position overlapping with the gate electrode; and a source electrode and a drain electrode over the oxide semiconductor film. The source electrode and the drain electrode each include a first metal film, a second metal film, and a third metal film, and the second metal film is in an inner region of end portions of the first metal film and the third metal film.

Further, another embodiment of the present invention is a semiconductor device including: a gate electrode; a gate insulating film over the gate electrode; an oxide semiconductor film in contact with the gate insulating film and in a position overlapping with the gate electrode; a source electrode and a drain electrode over the oxide semiconductor film; and a signal line electrically connected to the source electrode. The signal line includes a first metal film, a second metal film, and a third metal film. The second metal film is in an inner region of end portions of the first metal film and the third metal film. The source electrode and the drain electrode each include the first metal film and the third metal film.

In the above structure, the semiconductor device further includes, over the source electrode and the drain electrode: an oxygen-excess first insulating film; a second insulating film over the first insulating film; an aluminum oxide film over the second insulating film; and a planarization insulating film over the aluminum oxide film.

Further, in each of the above-described structures, the first metal film and the third metal film may each be a metal film or a metal nitride film containing one or more elements selected from tungsten, tantalum, titanium, and molybdenum. In addition, the second metal film may contain a copper element.

In each of the above-described structures, the gate electrode may contain one or more elements selected from tungsten, tantalum, titanium, molybdenum, and copper.

Furthermore, the present invention also includes, in its category, a display device and an electronic device which include the above-described semiconductor device.

A method for manufacturing a transistor with stable electric characteristics and little signal delay due to wiring resistance, used in a semiconductor device including an oxide semiconductor film, can be provided. Further, a semiconductor device including the transistor can be provided. Further, a high-performance display device including the transistor can be provided.

BRIEF DESCRIPTION OF THE DRAWINGS

FIG. 1A is a plan view of one embodiment of a semiconductor device and FIGS. 1B and 1C are cross-sectional views thereof.

FIGS. 13A to 13D are examples of tablet terminals each including a semiconductor device.

DETAILED DESCRIPTION OF THE INVENTION

Figure 2A:
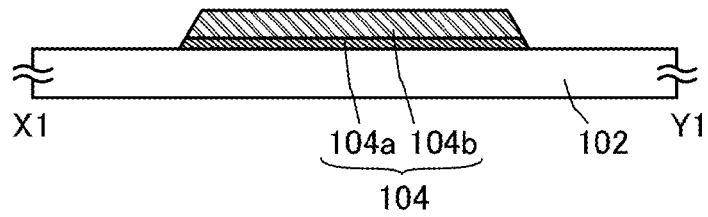
FIGS. 2A to 2E are cross-sectional views illustrating an example of a manufacturing process of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification or the like, patterning is performed by a photolithography process. Note that the patterning is not limited to a photolithography process and processes other than the photolithography process can be employed. Further, a mask formed in the photolithography process is removed after etching treatment.

Embodiment 1

In this embodiment, one embodiment of a semiconductor device and a manufacturing method thereof will be described with reference to FIGS. 1A to 1C, FIGS. 2A to 2E, FIGS. 3A to 3D, FIGS. 4A to 4D, and FIGS. 5A to 5C. In this embodiment, a transistor using an oxide semiconductor film is described as an example of the semiconductor device.

Structural Example 1 of Semiconductor Device

FIGS. 1A to 1C illustrate a structural example of a transistor 150. FIG. 1A is a plan view of the transistor 150, FIG. 1B is a cross-sectional view taken along the line X1-Y1 in FIG. 1A, and FIG. 1C is a cross-sectional view taken along the line V1-W1 in FIG. 1A. Note that in FIG. 1A, some components of the transistor 150 (e.g., a gate insulating film 106) are not illustrated for clarity.

The transistor 150 illustrated in FIGS. 1A to 1C includes a gate electrode 104 formed over a substrate 102, a gate insulating film 106 formed over the gate electrode 104, an oxide semiconductor film 108 formed in contact with the gate insulating film 106 and in a position which overlaps with the gate electrode 104, a source electrode 110 and a drain electrode 112 formed over the oxide semiconductor film 108.

The gate electrode 104 includes a first gate electrode 104a and a second gate electrode 104b. As the first gate electrode 104a, a metal film or a metal nitride film containing one or more elements selected from tungsten, tantalum, titanium, and molybdenum is preferably used. The second gate electrode 104b preferably contains a copper element. For example, in this embodiment, a tungsten film is used as the first gate electrode 104a and a copper film is used as the second gate electrode 104b. With such a stacked-layer structure, the gate electrode 104 can have low resistance. By providing the first gate electrode 104a, adhesion between the substrate 102 and the copper film used as the second gate electrode 104b can be improved and/or diffusion of the copper element in the copper film used as the second gate electrode 104b can be prevented.

The gate insulating film 106 includes a first gate insulating film 106a and a second gate insulating film 106b. It is sufficient that the first gate insulating film 106a has a function of preventing diffusion of the copper element in the copper film used as the second gate electrode 104b. As the first gate insulating film 106a, a silicon nitride film, a silicon nitride oxide film, an aluminum oxide film, an aluminum nitride oxide film, or the like can be used. It is sufficient that the second gate insulating film 106b has a function of supplying oxygen to the oxide semiconductor film 108 to be formed later. As the second gate insulating film 106b, a silicon oxide film, a silicon oxynitride film, or the like can be used. For example, in this embodiment, a silicon nitride film is used as the first gate insulating film 106a, and a silicon oxynitride film is used as the second gate insulating film 106b. With the gate insulating film 106 having such a stacked-layer structure, diffusion of the copper element in the copper film used as the gate electrode 104 can be prevented and oxygen can be supplied to the oxide semiconductor film 108 to be formed later.

The source electrode 110 includes a first metal film 110a, a second metal film 110b, and a third metal film 110c. The drain electrode 112 includes a first metal film 112a, a second metal film 112b, and a third metal film 112c. The second metal film 110b and the second metal film 112b are formed in the inner region of the end portions of the first metal film 110a and the first metal film 112a, and in the inner region of the end portions of the third metal film 110c and the third metal film 112c, respectively.

As the first metal film 110a, the first metal film 112a, the third metal film 110c, and the third metal film 112c, a metal film or a metal nitride film containing one or more elements selected from tungsten, tantalum, titanium, and molybdenum is preferably used. The second metal film 110b and the second metal film 112b preferably contain a copper element.

For example, in this embodiment, a tungsten film is used as the first metal film 110a and the first metal film 112a, a copper film is used as the second metal film 110b and the second metal film 112b, and a tantalum nitride film is used as the third metal film 110c and the third metal film 112c. The second metal film 110b and the second metal film 112b are formed over the first metal film 110a and the first metal film 112a and covered with the third metal film 110c and the third metal film 112c, respectively.

That is to say, a bottom surface of the copper film used as the second metal film 110b and the second metal film 112b is covered with the tungsten film used as the first metal film 110a and the first metal film 112a and a top surface and side surfaces thereof are covered with the tantalum nitride film used as the third metal film 110c and the third metal film 112c. The first metal film 110a, the first metal film 112a, the third metal film 110c, and the third metal film 112c have a function as a barrier metal for preventing diffusion of the copper element in the copper film.

With the source electrode 110 and the drain electrode 112 having such structures, the source electrode 110 and the drain electrode 112 can have low resistance and diffusion of the copper element in the copper film used in the source electrode 110 and the drain electrode 112 to the outside can be prevented.

As a method for forming the source electrode 110 and the drain electrode 112, for example, the first metal film and the second metal film are formed over the oxide semiconductor film 108, first photolithography process is performed on the second metal film, and first etching is performed so that the second metal film is partly removed, whereby the second metal film 110b and the second metal film 112b are formed. Then, the third metal film is formed over the first metal film and the second metal film (the second metal film 110b and the second metal film 112b) so as to cover the second metal film. Then, second photolithography process is performed on the third metal film, and the first metal film and the third metal film are partly removed by second etching, whereby the first metal film 110a, the first metal film 112a, the third metal film 110c, and the third metal film 112c are formed. With such a formation method, the copper film used as the second metal film is not directly in contact with the oxide semiconductor film 108, so that diffusion of impurities (in particular, a copper element) which might enter a back channel portion of the oxide semiconductor film 108 can be prevented.

Furthermore, a structure that includes an oxygen-excess first insulating film 114a over the source electrode 110 and the drain electrode 112, a second insulating film 114b formed over the first insulating film 114a, an aluminum oxide film 116 formed over the second insulating film 114b, and a planarization insulating film 118 formed over the aluminum oxide film 116 may also be used.

Note that the details of the other components will be described below in an example of a method for manufacturing the transistor 150 illustrated in FIGS. 1A to 1C, with reference to FIGS. 2A to 2E, FIGS. 3A to 3D, FIGS. 4A to 4D, and FIGS. 5A to 5C.

Method 1 for Manufacturing Semiconductor Device

First, the gate electrode 104 including the first gate electrode 104a and the second gate electrode 104b is formed over the substrate 102 (see FIG. 2A).

Although there is no particular limitation on a substrate that can be used as the substrate 102, it is necessary that the substrate have heat resistance to withstand at least a heat treatment performed later. For example, a variety of glass substrates for electronics industry, such as a barium borosilicate glass substrate or an aluminoborosilicate glass substrate can be used. Note that as the substrate, a glass substrate having a coefficient of thermal expansion which is greater than or equal to $25 \times 10^{-7}/°$ C. and less than or equal to $50 \times 10^{-7}/°$ C. (preferably, greater than or equal to $30 \times 10^{-7}/°$ C. and less than or equal to $40 \times 10^{-7}/°$ C.) and a strain point which is higher than or equal to 650° C. and lower than or equal to 750° C. (preferably, higher than or equal to 700° C. and lower than or equal to 740° C.) is preferably used.

In the case where a large-sized glass substrate having the size of the fifth generation (1000 mm×1200 mm or 1300 mm×1500 mm), the sixth generation (1500 mm×1800 mm), the seventh generation (1870 mm×2200 mm), the eighth generation (2200 mm×2500 mm), the ninth generation (2400 mm×2800 mm), the tenth generation (2880 mm×3130 mm), or the like is used, minute processing might become difficult owing to shrinkage of the substrate caused by heat treatment or the like in the manufacturing process of a semiconductor device. Therefore, in the case where the above-described large-sized glass substrate is used as the substrate, a substrate with little shrinkage is preferably used. For example, the substrate can be a large-sized glass substrate in which, after heat treatment which is performed for one hour at preferably 450° C., more preferably 500° C., the amount of shrinkage is less than or equal to 20 ppm, preferably less than or equal to 10 ppm, more preferably less than or equal to 5 ppm.

Alternatively, the semiconductor device may be manufactured using a flexible substrate as the substrate 102. In order to manufacture a flexible semiconductor device, the transistor 150 including the oxide semiconductor film 108 may be directly formed over a flexible substrate, or the transistor 150 including the oxide semiconductor film 108 may be formed over a manufacturing substrate, and then, the transistor 150 may be separated from the manufacturing substrate and transferred to a flexible substrate. Note that in order to separate the transistor 150 from the manufacturing substrate and transfer it to the flexible substrate, a separation layer may be provided between the manufacturing substrate and the transistor 150 including the oxide semiconductor film.

Further, a base insulating film may be provided over the substrate 102. The base insulating film can be formed by a plasma CVD method, a sputtering method, or the like using an oxide insulating film such as a silicon oxide film, a silicon oxynitride film, an aluminum oxide film, an aluminum oxynitride film, a hafnium oxide film, or a gallium oxide film; a nitride insulating film such as a silicon nitride film, a silicon nitride oxide film, an aluminum nitride film, or an aluminum nitride oxide film; or a mixed material thereof.

Further, the substrate 102 is preferably subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to one hour.

The gate electrode 104 can be formed using a material including one or more elements selected from tungsten, tantalum, titanium, molybdenum, and copper. In this embodiment, as the second gate electrode 104b, a copper film with a thickness greater than or equal to 100 nm and less than or equal to 400 nm is formed by a sputtering method. Moreover, as a layer under the second gate electrode 104b, the first gate electrode 104a which functions as a barrier metal for preventing diffusion of the copper element in the copper film is formed. In this embodiment, as the first gate electrode 104a, a tantalum nitride film with a thickness greater than or equal to 20 nm and less than or equal to 100 nm is formed by a sputtering method.

Note that the stacked-layer structure of the first gate electrode 104a and the second gate electrode 104b is described in this embodiment; however, the present invention is not limited to this structure. For example, a third gate electrode may be provided over the second gate electrode 104b. As the third gate electrode, a material similar to that of the first gate electrode 104a can be used.

Figure 2B:
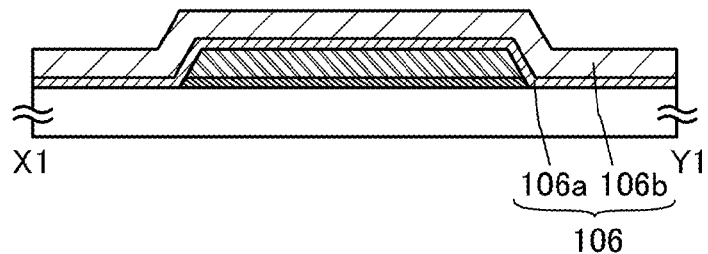

Next, the gate insulating film 106 including the first gate insulating film 106a and the second gate insulating film 106b is formed over the substrate 102 and the gate electrode 104 (see FIG. 2B).

For the first gate insulating film 106a, a nitride insulating film formed by a plasma CVD method, a sputtering method, or the like is preferably used. The thickness of the nitride insulating film is preferably greater than or equal to 10 nm and less than or equal to 100 nm, further preferably greater than or equal to 20 nm and less than or equal to 50 nm. For example, a silicon nitride film and a silicon nitride oxide film can be given. A nitride insulating film is used as the first gate insulating film 106a which is in contact with the substrate 102 and the gate electrode 104, thereby preventing diffusion of impurities from the substrate 102 and the gate electrode 104. In particular, in the case where a metal material containing a copper element is used as the gate electrode 104 (more specifically, the second gate electrode 104b), the first gate insulating film 106a can prevent diffusion of the copper element to the oxide semiconductor film 108.

In this embodiment, as the first gate insulating film 106a, a 50-nm-thick silicon nitride film formed by a plasma CVD method is used. As a gas used for forming the silicon nitride film, a mixed gas of silane ($SiH_4$) and nitrogen, a mixed gas of silane, nitrogen, and ammonia ($NH_3$), or the like can be used.

For the second gate insulating film 106b, an oxide insulating film formed by a plasma CVD method, a sputtering method, or the like is preferably used. The thickness of the oxide insulating film is preferably greater than or equal to 100 nm and less than or equal to 350 nm, further preferably greater than or equal to 100 nm and less than or equal to 200 nm. For example, a silicon oxide film, a gallium oxide film, an aluminum oxide film, a silicon oxynitride film, an aluminum oxynitride film can be given.

The second gate insulating film 106b can be formed using a high-k material such as a hafnium oxide film, an yttrium oxide film, a hafnium silicate film ($HfSi_xO_y$ (x>0, y>0)), a hafnium silicate film to which nitrogen is added ($HfSiO_xN_y$ (x>0, y>0)), a hafnium aluminate film ($HfAl_xO_y$ (x>0, y>0)), or a lanthanum oxide film, whereby gate leakage current can be reduced.

In this embodiment, as the second gate insulating film 106b, a 200-nm-thick silicon oxynitride film formed by a plasma CVD method is used. The film formation time in the case of using a plasma CVD method can be made shorter than that of the case of using a sputtering method. Further, with a plasma CVD method, variation in the film thickness of the second gate insulating film 106b which is formed is smaller and entry of particles into the plane thereof occurs less frequently than those in the case of using a sputtering method.

Note that since the second gate insulating film 106b is an insulating film in contact with the oxide semiconductor film 108, it is preferable to contain oxygen and also preferable to contain impurities such as water or hydrogen as little as possible. However, in the case of using a plasma CVD method, it is more difficult to reduce the concentration of hydrogen in the layer than the case of using a sputtering method. Thus, heat treatment for reducing (preferably, removing) hydrogen atoms (the treatment is dehydration or dehydrogenation treatment) may be performed on the second gate insulating film 106b.

The heat treatment is performed at higher than or equal to 250° C. and lower than or equal to 650° C., preferably higher than or equal to 450° C. and lower than or equal to 600° C. or lower than the strain point of the substrate. For example, the substrate is introduced into an electric furnace which is one of heat treatment apparatuses, and heat treatment is performed on the gate insulating film 106 at 650° C. for one hour in vacuum (under reduced pressure).

Note that the heat treatment apparatus is not limited to the electric furnace, and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high temperature gas. As the high temperature gas, an inert gas which does not react with an object by heat treatment, such as nitrogen or a rare gas like argon, is used. Note that in the case where a GRTA apparatus is used as the heat treatment apparatus, the substrate may be heated in an inert gas heated to a high temperature of 650° C. to 700° C. because the heat treatment time is short.

The heat treatment may be performed in an atmosphere of nitrogen, oxygen, ultra-dry air (air in which a water content is 20 ppm or less, preferably 1 ppm or less, further preferably 10 ppb or less), or a rare gas (argon, helium, or the like). Note that it is preferable that water, hydrogen, and the like be not contained in the atmosphere of nitrogen, oxygen, ultra-dry air, or a rare gas. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

With the heat treatment, dehydration or dehydrogenation can be performed on the gate insulating film 106, so that the gate insulating film 106 from which impurities such as hydrogen and water causing variation in the characteristics of the transistor are removed can be formed.

The heat treatment for dehydration or dehydrogenation may be performed plural times, and may also serve as another heat treatment.

Figure 2C:
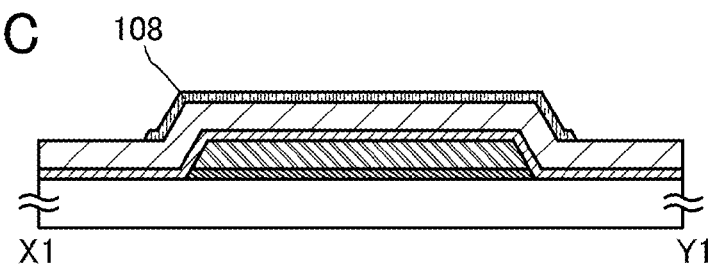

Next, the oxide semiconductor film 108 is formed in contact with the gate insulating film 106 so as to overlap with the gate electrode 104 (see FIG. 2C).

The oxide semiconductor film 108 may have either a single-layer structure or a stacked-layer structure. Further, the oxide semiconductor layer may either have an amorphous structure or a crystalline structure. In the case where the oxide semiconductor film 108 has an amorphous structure, heat treatment may be performed on the oxide semiconductor film 108 in a later manufacturing step so that the oxide semiconductor film has crystallinity. The heat treatment for crystallizing the amorphous oxide semiconductor film is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor film 108 can be formed by a sputtering method, a molecular beam epitaxy (MBE) method, a plasma CVD method, a pulse laser deposition method, an atomic layer deposition (ALD) method, or the like as appropriate.

When the oxide semiconductor film 108 is formed, it is preferable that the concentration of hydrogen contained in the oxide semiconductor film 108 be reduced as much as possible. In order to reduce the hydrogen concentration, for example, in the case where a sputtering method is used for film formation, a high-purity rare gas (typically, argon) from which impurities such as hydrogen, water, a hydroxyl group, and a hydride have been removed; oxygen; or a mixed gas of oxygen and the rare gas is used as appropriate as an atmosphere gas supplied to a treatment chamber of a sputtering apparatus.

The oxide semiconductor film 108 is formed in such a manner that a sputtering gas from which hydrogen and water have been removed is introduced into the treatment chamber while moisture remaining in the treatment chamber is removed, whereby the hydrogen concentration in the formed oxide semiconductor film 108 can be reduced. In order to remove moisture remaining in the treatment chamber, an entrapment vacuum pump such as a cryopump, an ion pump, or a titanium sublimation pump is preferably used. A turbo molecular pump provided with a cold trap may be used. The cryopump has a high capability in removing a hydrogen molecule, a compound containing a hydrogen atom such as water ($H_2O$) (more preferably, also a compound containing a carbon atom), and the like; thus, the impurity concentration in the oxide semiconductor film 108 formed in the treatment chamber which is evacuated with the cryopump can be reduced.

Note that in this embodiment, the oxide semiconductor film 108 is formed by a sputtering method using a metal oxide target with an atomic ratio of In:Ga:Zn=1:1:1 or a metal oxide target with an atomic ratio of In:Ga=2:1. Note that the target that can be used for forming the oxide semiconductor film 108 is not limited to the target including the above materials with the above ratios. Further, the oxide semiconductor film 108 can be formed by a sputtering method in a rare gas (typically argon) atmosphere, an oxygen atmosphere, or a mixed atmosphere of a rare gas and oxygen. Further, the target that can be used for forming the oxide semiconductor film 108 preferably has crystallinity; that is, a single crystalline target, a polycrystalline target, or the like are preferably used. With the use of the target having crystallinity, a formed thin film also has crystallinity; specifically, the formed thin film tends to have a c-axis-aligned crystal.

In addition, the oxide semiconductor film 108 immediately after being formed is preferably in a supersaturated state where the amount of oxygen exceeds the amount of oxygen in the stoichiometric composition. For example, when the oxide semiconductor film 108 is formed by a sputtering method, it is preferable that the film be formed in a film formation gas containing a high percentage of oxygen, and it is especially preferable that the film be formed under an oxygen atmosphere (oxygen gas 100%). For example, when the oxide semiconductor film 108 is formed using an In—Ga—Zn-based oxide (IGZO) under a condition that the proportion of oxygen in the film formation gas is large (in particular, oxygen gas: 100%), Zn release from the film can be suppressed even when the film formation temperature is 300° C. or higher.

Further, when the oxide semiconductor film 108 is formed using the above metal oxide target with the atomic ratio of In:Ga:Zn=1:1:1, the composition of the target is different from the composition of a thin film formed over the substrate in some cases. For example, when the metal oxide target with the atomic ratio of In:Ga:Zn=1:1:1 is used, the composition ratio of the oxide semiconductor film 108, which is the thin film, becomes In:Ga:Zn=1:1:0.6 to 1:1:0.8 in an atomic ratio in some cases, though it depends on the film formation conditions. This is because in formation of the oxide semiconductor film 108, Zn is sublimed, or because a sputtering rate differs between the components of In, Ga, and Zn.

Accordingly, when a thin film having a preferable composition ratio is formed, a composition ratio of the metal oxide target needs to be adjusted in advance. For example, in order to make the composition ratio of the thin oxide semiconductor film 108 be In:Ga:Zn=1:1:1 in an atomic ratio, the composition ratio of the metal oxide target is made to be In:Ga:Zn=1:1:1.5 in an atomic ratio. In other words, the content percentage of Zn in the metal oxide target is preferably made higher in advance. The composition ratio of the target is not limited to the above value, and can be adjusted as appropriate depending on the film formation conditions or the composition of the thin film to be formed. Further, it is preferable to increase the content percentage of Zn in the metal oxide target because in that case, the obtained thin film can have higher crystallinity.

Further, in the case where the oxide semiconductor film 108 is formed by a sputtering method, the relative density of the metal oxide target which is used for forming the oxide semiconductor film 108 is greater than or equal to 90% and less than or equal to 100%, preferably greater than or equal to 95%, more preferably greater than or equal to 99.9%. With the use of the metal oxide target with a high relative density, the formed oxide semiconductor film 108 can be a dense film.

In order to reduce the impurity concentration in the oxide semiconductor film 108, it is also effective to form the oxide semiconductor film 108 while the substrate 102 is kept at high temperature. The heating temperature of the substrate 102 may be higher than or equal to 150° C. and lower than or equal to 450° C., preferably higher than or equal to 170° C. and lower than or equal to 350° C. By heating the substrate at a high temperature during the film formation, the oxide semiconductor film 108 having crystallinity can be formed.

An oxide semiconductor to be used for the oxide semiconductor film 108 preferably contains at least indium (In) or zinc (Zn). In particular, both In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0 is satisfied, n is an integer) may be used.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The oxide semiconductor film 108 is preferably a c-axis aligned crystalline oxide semiconductor (CAAC-OS) film.

The CAAC-OS film is not completely single crystal nor completely amorphous. The CAAC-OS film is an oxide semiconductor layer with a crystal-amorphous mixed phase structure where crystalline portions are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

There are three methods for obtaining a CAAC-OS film when the CAAC-OS film is used as the oxide semiconductor film 108. The first method is to form an oxide semiconductor layer at a film formation temperature higher than or equal to 100° C. and lower than or equal to 450° C., more preferably higher than or equal to 150° C. and lower than or equal to 400° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Note that when an oxide semiconductor film having crystallinity different from the CAAC-OS film (single crystal or microcrystalline) is formed as the oxide semiconductor film 108, the film formation temperature is not particularly limited.

The energy gap of the oxide semiconductor film 108 is 2.8 eV to 3.2 eV, and is greater than that of silicon (1.1 eV). The intrinsic carrier density of the oxide semiconductor film 108 is $10^{-9}$ cm$^{-3}$, which is much smaller than the intrinsic carrier density of silicon ($10^{11}$ cm$^{-3}$).

Majority carriers (electrons) of the oxide semiconductor film 108 flow only from a source of a transistor. Further, a channel formation region can be depleted completely. Thus, an off-state current of the transistor can be extremely small. The off-state current of the transistor including the oxide semiconductor film 108 is as small as 10 yA/μm or less at room temperature, and 1 zA/μm or less at 85° C. to 95° C.

Note that the oxide semiconductor film 108 may have a structure in which a plurality of oxide semiconductor layers are stacked. For example, the oxide semiconductor film 108 may have a stacked-layer structure of a first oxide semiconductor layer and a second oxide semiconductor layer which are formed using metal oxides with different compositions. For example, the first oxide semiconductor layer may be formed using a three-component metal oxide, and the second oxide semiconductor layer may be formed using a two-component metal oxide. Alternatively, both the first oxide semiconductor layer and the second oxide semiconductor layer may be formed using a three-component metal oxide.

Further, the constituent elements of the first oxide semiconductor layer and the second oxide semiconductor layer may be made to be the same and the composition of the constituent elements may be made to be different from each other. For example, the first oxide semiconductor layer may have an atomic ratio of In:Ga:Zn=1:1:1 and the second oxide semiconductor layer may have an atomic ratio of In:Ga:Zn=3:1:2. Alternatively, the first oxide semiconductor layer may have an atomic ratio of In:Ga:Zn=1:3:2 and the second oxide semiconductor layer may have an atomic ratio of In:Ga:Zn=2:1:3.

At this time, one of the first oxide semiconductor layer and the second oxide semiconductor layer which is closer to the gate electrode (on a channel side) preferably contains In and Ga at a proportion of In>Ga. The other which is farther from the gate electrode (on a back channel side) preferably contains In and Ga at a proportion of In≤Ga. In an oxide semiconductor, the s orbital of heavy metal mainly contributes to carrier transfer, and when the In content in the oxide semiconductor is increased, overlap of the s orbital is likely to be increased. Therefore, an oxide having a composition of In>Ga has higher mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In>Ga. Thus, an oxide semiconductor layer containing In and Ga at a proportion of In>Ga is used on a channel side, and an oxide semiconductor layer containing In and Ga at a proportion of In≤Ga is used on a back channel side; so that the mobility and reliability of the transistor can be further improved.

Further, when the oxide semiconductor film 108 has a stacked-layer structure, the first oxide semiconductor layer and the second oxide semiconductor layer may be formed using oxide semiconductors having different crystallinity. That is, the oxide semiconductor film 108 may have a structure in which two of a single crystal oxide semiconductor, a polycrystalline oxide semiconductor, an amorphous oxide semiconductor, and an oxide semiconductor having crystallinity (for example, CAAC-OS) are combined as appropriate. When an amorphous oxide semiconductor is used for at least one of the first oxide semiconductor layer and the second oxide semiconductor layer, internal stress or external stress of the oxide semiconductor is relieved, variation in characteristics of a transistor is reduced, and reliability of the transistor can be further improved. On the other hand, in the amorphous oxide semiconductor, an impurity acting as a donor, such as hydrogen, is easily absorbed and oxygen deficiency easily occur; thus, the amorphous oxide semiconductor is likely to be n-type. Therefore, it is preferable that the oxide semiconductor having crystallinity (for example, CAAC-OS) be used for the oxide semiconductor layer on the channel side.

In the case of the oxide semiconductor film 108 having a stacked-layer structure, the stacked-layer structure with the following composition and combination of crystallinity can be given: a stacked-layer structure in which an amorphous oxide semiconductor layer with an atomic ratio in the neighborhood of In:Ga:Zn=1:1:1 and a crystalline oxide semiconductor layer with an atomic ratio in the neighborhood of In:Ga:Zn=3:1:2 which are stacked over the gate insulating film 106 in this order, or a stacked-layer structure in which a crystalline oxide semiconductor layer with an atomic ratio in the neighborhood of In:Ga:Zn=1:1:1 and a crystalline oxide semiconductor layer with an atomic ratio in the neighborhood of In:Ga:Zn=3:1:2 which are stacked over the gate insulating film 106 in this order. Other than the above stacked-layer structures, the following may be employed: a stacked-layer structure in which a crystalline oxide semiconductor layer with an atomic ratio in the neighborhood of In:Ga:Zn=3:1:2 and a crystalline oxide semiconductor layer with an atomic ratio in the neighborhood of In:Ga:Zn=1:1:1, a stacked-layer structure in which an amorphous oxide semiconductor layer with an atomic ratio in the neighborhood of In:Ga:Zn=1:1:1 and an amorphous oxide semiconductor layer with an atomic ratio in the neighborhood of In:Ga:Zn=3:1:2, or a stacked-layer structure in which an amorphous oxide semiconductor layer with an atomic ratio in the neighborhood of In:Ga:Zn=3:1:2 and an amorphous oxide semiconductor layer with an atomic ratio in the neighborhood of In:Ga:Zn=1:1:1.

Before the oxide semiconductor film 108 is formed, planarization treatment may be performed on the surface on which the oxide semiconductor film 108 is to be formed. As the planarization treatment, polishing treatment (e.g., chemical mechanical polishing (CMP)), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a substrate surface is modified. Note that instead of argon, nitrogen, helium, oxygen or the like may be used. The reverse sputtering can remove particle substances (also referred to as particles or dust) attached to the surface on which the oxide semiconductor film 108 is to be formed.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface on which the oxide semiconductor film 108 is to be formed.

Further, after the oxide semiconductor film 108 is formed, the oxide semiconductor film 108 is preferably subjected to heat treatment for reducing or removing excess hydrogen (including water and a hydroxyl group) contained in the oxide semiconductor film 108 (dehydration or dehydrogenation). The heat treatment can be performed in a condition similar to that of the heat treatment of the second gate insulating film 106b described above.

The heat treatment enables reduction, more preferably removal of hydrogen, which is an impurity imparting n-type conductivity, in the oxide semiconductor film 108. Further, in the case where an insulating film containing oxygen is used as the second gate insulating film 106b, by this heat treatment, oxygen contained in the second gate insulating film 106b can be supplied to the oxide semiconductor film 108. While oxygen is released from the oxide semiconductor film 108 by the dehydration or dehydrogenation treatment, oxygen is supplied from the second gate insulating film 106b to the oxide semiconductor film 108, whereby oxygen vacancies in the oxide semiconductor film 108 can be filled.

Further, after the oxide semiconductor film 108 is heated through the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) may be introduced into the same furnace while the heating temperature is maintained or gradually decreased. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). While oxygen is reduced by removing an impurity for the dehydration or dehydrogenation, the oxygen gas or the dinitrogen monoxide gas acts to supply oxygen that is a main component of the oxide semiconductor film 108, so that the oxide semiconductor film 108 can have high purity and be an i-type (intrinsic) oxide semiconductor film.

The heat treatment for dehydration or dehydrogenation may serve as another heat treatment of a manufacturing process of the transistor 150.

Figure 2D:
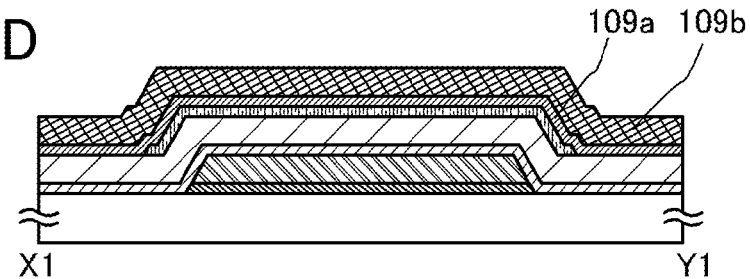

Next, a first metal film 109a and a second metal film 109b to be a source electrode and a drain electrode (as well as a wiring formed in the same layer as the source electrode and the drain electrode) are formed over the gate insulating film 106 and the oxide semiconductor film 108 (see FIG. 2D).

The first metal film 109a is preferably a metal film or a metal nitride film containing one or more elements selected from tungsten, tantalum, titanium, and molybdenum. In this embodiment, as the first metal film 109a, a 50-nm-thick tungsten film formed by a sputtering method is used.

Further, the first metal film 109a may have a stacked-layer structure. For example, the stacked-layer structure of the first metal film 109a includes a metal film containing one or more elements selected from tungsten, tantalum, titanium, and molybdenum as a first layer, and a metal nitride film containing one or more elements selected from tungsten nitride, tantalum nitride, titanium nitride and molybdenum nitride as a second layer.

For the first metal film 109a, since the first metal film 109a is in contact with the oxide semiconductor film 108, a material which does not extract oxygen from the oxide semiconductor film 108 and does not make the oxide semiconductor film 108 have n-type conductivity, or a material which is not diffused into the oxide semiconductor film 108 and does not make the oxide semiconductor film 108 have n-type conductivity is used. In addition, a material which prevents diffusion of a copper element from a copper film used as the second metal film 109b to the oxide semiconductor film 108 (such a material is called as a barrier metal material) is preferably used for the first metal film 109a.

The second metal film 109b preferably contains a copper element. Note that a copper alloy or the like in which aluminum, gold, silver, zinc, tin, nickel, or the like is added at several weight percent to copper may be used. In this embodiment, as the second metal film 109b, a 200-nm-thick copper film formed by a sputtering method is used.

Figure 2E:
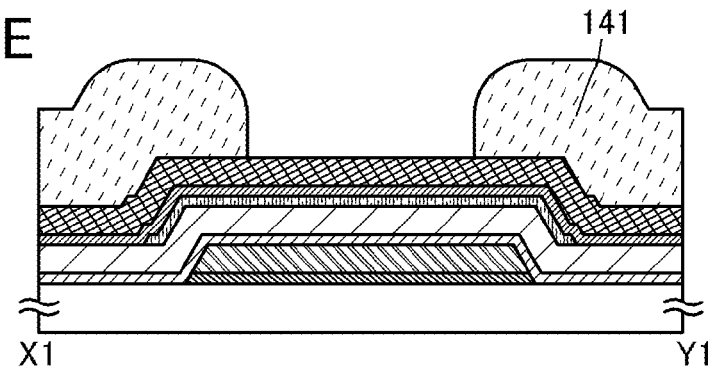

Next, a resist is applied over the second metal film 109b and the first patterning is performed, so that a resist mask 141 is formed (see FIG. 2E).

The resist mask 141 can be formed in such a manner that a photosensitive resin is applied, and then the photosensitive resin is exposed and developed. Note that the photosensitive resin may be a negative-type or positive-type photosensitive resin. Alternatively, the resist mask 141 may be formed by an inkjet method, in which case manufacturing costs can be reduced because a photomask is not used.

Figure 3A:
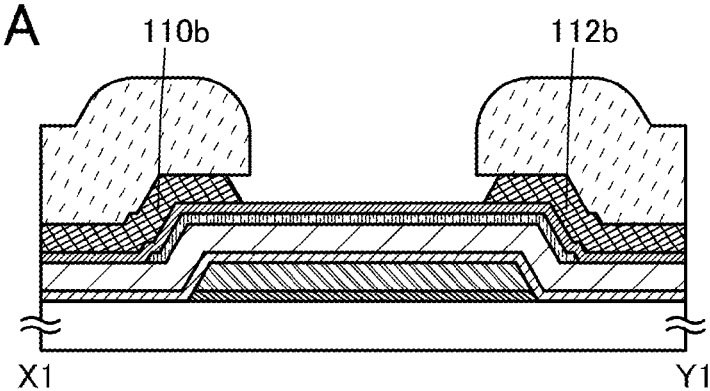
FIGS. 3A to 3D are cross-sectional views illustrating an example of the manufacturing process of the semiconductor device.

Next, the second metal film 109b is partly removed by the first etching, so that the second metal film 110b and the second metal film 112b are formed (see FIG. 3A).

As a method for removing the second metal film 109b, a wet etching method is preferable. As a chemical solution used in the wet etching method, it is preferable that a chemical solution which can etch the second metal film 109b and does not remove the first metal film 109a be used. For example, in the case where a tungsten film is used as the first metal film 109a and a copper film is used as the second metal film 109b, a mixed solution of water, hydrogen peroxide water, and carboxylic acid; a mixed solution of water, phosphoric acid, nitric acid, sulfuric acid, and potassium sulfate; or the like can be used as the chemical solution.

Further, by adjusting a wet etching time and performing isotropic etching, the side surfaces of the second metal film 110b and the second metal film 112b may be receded to be at the inner side of the side surfaces of the resist mask 141.

Figure 3B:
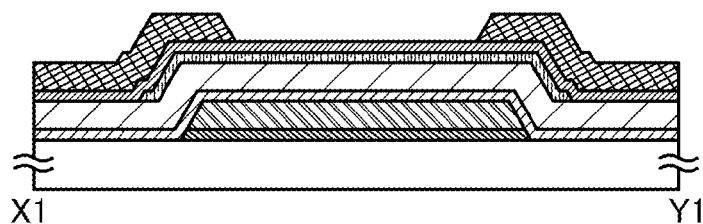

Next, the resist mask 141 is removed (see FIG. 3B).

As a method for removing the resist mask 141, a wet removing method using a stripping solution, a dry removing method such as plasma treatment, a combination thereof, or the like can be used.

Figure 3C:
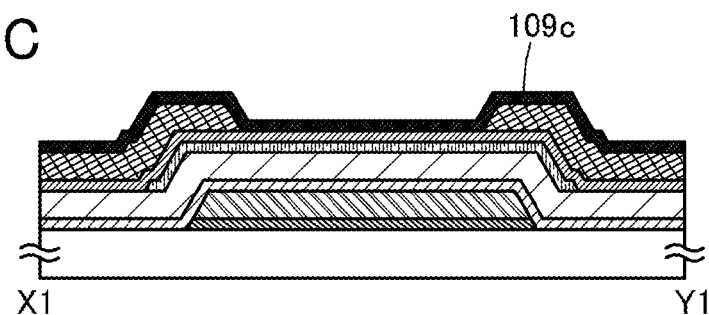

Next, a third metal film 109c is formed over the first metal film 109a, the second metal film 110b, and the second metal film 112b (see FIG. 3C).

The third metal film 109c can be formed using a method and a material similar to those of the first metal film 109a. Note that in this embodiment, as the third metal film 109c, a 100-nm-thick tantalum nitride film formed by a sputtering method is used.

Figure 3D:
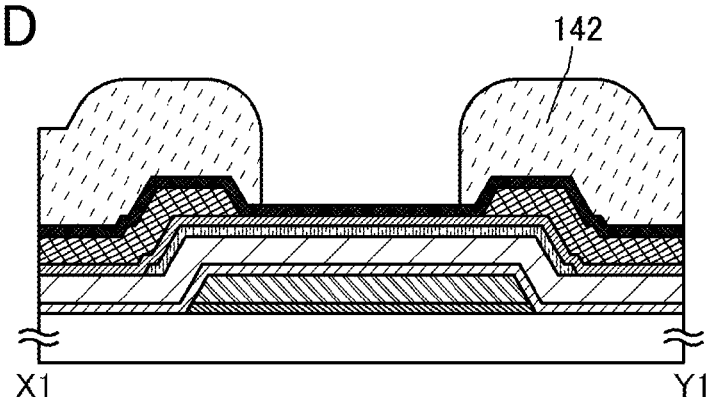

Next, a resist is applied over the third metal film 109c, and the second patterning is performed, whereby a resist mask 142 is formed (see FIG. 3D).

The resist mask 142 can be formed using a material and a method similar to those of the resist mask 141.

Figure 4A:
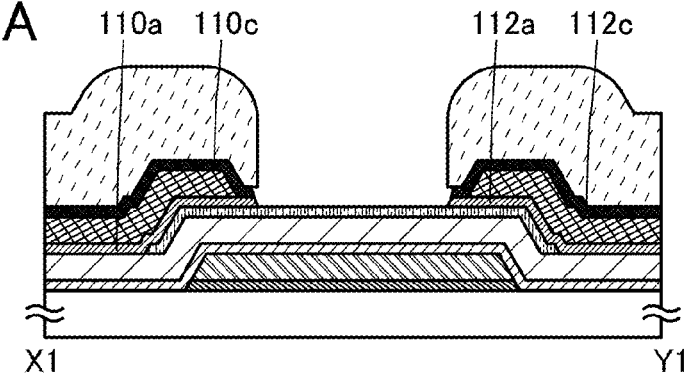
FIGS. 4A to 4D are cross-sectional views illustrating an example of the manufacturing process of the semiconductor device.

Next, the first metal film 109a and the third metal film 109c are partly removed by the second etching, whereby the first metal film 110a, the first metal film 112a, the third metal film 110c, and the third metal film 112c are formed (see FIG. 4A).

Note that the first metal film 109a and the third metal film 109c are partly removed by the second etching so that the removed portions are at the outer side of the end portions of the second metal film 110b and the second metal film 112b which are removed by the first etching.

As a method for removing the first metal film 109a and the third metal film 109c, a dry etching method is preferably used. As a gas used for the dry etching method, for example, in the case where a tungsten film is used as the first metal film 109a and a tantalum nitride film is used as the third metal film 109c, a mixed gas containing $SF_6$ and $O_2$, a mixed gas containing $SF_6$ and $BCl_3$, or the like can be used.

Note that it is desirable that etching conditions be optimized so as not to etch and divide the oxide semiconductor film 108 when the first metal film 109a and the third metal film 109c are etched. However, it is difficult to obtain etching conditions in which only the first metal film 109a and the third metal film 109c are etched and the oxide semiconductor film 108 is not etched at all. In some cases, when the first metal film 109a and the third metal film 109c are etched, the oxide semiconductor film 108 is partly etched to have a groove portion (a recessed portion).

Figure 4B:
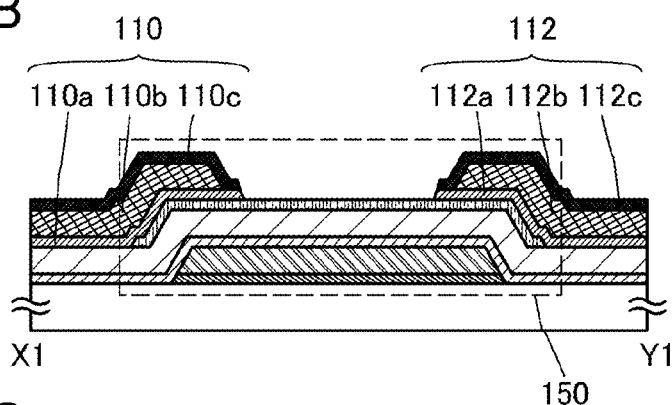
Figure 4C:
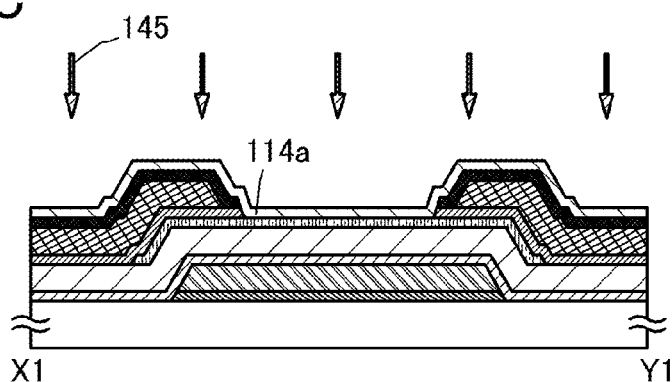

Next, the resist mask 142 is removed, and the source electrode 110 including the first metal film 110a, the second metal film 110b, and the third metal film 110c and the drain electrode 112 including the first metal film 112a, the second metal film 112b, and the third metal film 112c are formed (see FIG. 4B).

With such a method of forming the source electrode 110 and the drain electrode 112, the oxide semiconductor film 108 (more specifically, the back channel side thereof) is not in contact with the copper films used as the second metal film 110b and the second metal film 112b; thus, it is possible to prevent a copper element from attaching or diffusing to the oxide semiconductor film 108.

Note that the resist mask 142 can be removed by a method similar to that of the resist mask 141.

Further, after the source electrode 110 and the drain electrode 112 are formed, the oxide semiconductor film 108 (more specifically, the back channel side thereof) is preferably cleaned. The oxide semiconductor film 108 is effectively cleaned by oxygen plasma treatment, cleaning treatment by treatment with dilute hydrofluoric acid, or the like. By performing such a cleaning, an etching gas component used in forming the source electrode 110 and the drain electrode 112, a residue of the resist mask 142, or the like can be removed from the oxide semiconductor film 108, so that the oxide semiconductor film 108 can be more purified.

Further, after the source electrode 110 and the drain electrode 112 are formed, heart treatment may be performed. The heat treatment is performed at a temperature higher than or equal to 250° C. and lower than or equal to 650° C., preferably higher than or equal to 450° C. and lower than or equal to 600° C., or lower than the strain point of the substrate.

Through the above process, the transistor 150 described in this embodiment is formed.

Next, the first insulating film 114a is formed over the transistor 150, more specifically over the oxide semiconductor film 108, the source electrode 110, and the drain electrode 112. Then, oxygen 145 is introduced into the first insulating film 114a and the oxide semiconductor film 108 (see FIG. 4C).

The first insulating film 114a can be formed using an oxide insulating film such as a silicon oxide film, a gallium oxide film, an aluminum oxide film, a silicon oxynitride film, or an aluminum oxynitride film by a plasma CVD method or a sputtering method. The thickness of the first insulating film 114a is preferably greater than or equal to 50 nm and less than or equal to 100 nm.

Further, the first insulating film 114a is preferably an oxygen-excess oxide insulating film. With the oxygen-excess oxide insulating film, oxygen can be efficiently supplied to the oxide semiconductor film 108.

In this embodiment, a 30-nm-thick silicon oxynitride film is formed as the first insulating film 114a by a plasma CVD method. The conditions for forming the first insulating film 114a can be as follows: for example, the gas flow rate ratio of $SiH_4$ to $N_2O$ is 20 sccm:3000 sccm; the pressure is 200 Pa; the RF power supply (power supply output) is 100 W; and the substrate temperature is 350° C.±15° C. Note that like the gate insulating film 106, the first insulating film 114a preferably contains impurities such as water or hydrogen as little as possible because it is an insulating film in contact with oxide semiconductor film 108.

The oxygen 145 contains at least any of an oxygen radical, ozone, an oxygen atom, and an oxygen ion (an oxygen molecular ion and/or an oxygen cluster ion).

Introducing the oxygen 145 into the first insulating film 114a can be performed by, for example, an ion implantation method, an ion doping method, a plasma immersion ion implantation method, plasma treatment, or the like. Note that for the ion implantation method, a gas cluster ion beam may be used. The oxygen 145 may be introduced into the entire area of the first insulating film 114a at a time. Alternatively, a linear ion beam is used for introducing oxygen 145. In the case of using the linear ion beam, the substrate or the ion beam is relatively moved (scanned), whereby the oxygen 145 can be introduced into the entire area of the first insulating film 114a.

As a gas for supplying the oxygen 145, a gas containing oxygen may be used. For example, an $O_2$ gas, an $N_2O$ gas, a $CO_2$ gas, a CO gas, a $NO_2$ gas, or the like can be used. Note that a rare gas (e.g., argon) may be contained in a gas for supplying oxygen.

Further, in the case where an ion implantation method is used for introducing oxygen, the dose of the oxygen 145 is preferably greater than or equal to $1 \times 10^{13}$ ions/cm$^2$ and less than or equal to $5 \times 10^{16}$ ions/cm$^2$. The content of oxygen in the first insulating film 114a after the oxygen-introducing treatment preferably exceeds that of the stoichiometric composition of the first insulating film 114a. The depth at which oxygen is implanted may be adjusted as appropriate by implantation conditions.

Note that in the case where an oxide insulating film (e.g., a silicon oxide film or a silicon oxynitride film) is used as the first insulating film 114a, oxygen is one of main components in the oxide insulating film. Therefore, it is difficult to estimate the oxygen concentration of the oxide insulating film accurately with secondary ion mass spectrometry (SIMS) or the like. That is, it is difficult to judge whether oxygen is intentionally added to the oxide insulating film or not. Further, the same can be applied to the case where oxygen contained excessively in the first insulating film 114a is supplied to the oxide semiconductor film 108 in a later step.

It is known that there are isotopes of oxygen, such as $^{17}O$ and $^{18}O$, and that the proportions of $^{17}O$ and $^{18}O$ in all of the oxygen atoms in nature are approximately 0.038% and approximately 0.2%, respectively. That is to say, it is possible to measure the concentrations of these isotopes in the oxide semiconductor film or the insulating film (the first insulating film 114a in this embodiment) in contact with the oxide semiconductor film by a method such as SIMS; therefore, the oxygen concentration of the oxide semiconductor film or the insulating film in contact with the oxide semiconductor film may be able to be estimated more accurately by measuring the concentrations of these isotopes. Thus, the concentration of the isotope may be measured to determine whether or not oxygen is intentionally added to the insulating film in contact with the oxide semiconductor film.

By such a treatment for introducing the oxygen 145, the oxygen-excess first insulating film 114a is formed. With the oxygen-excess first insulating film 114a, oxygen can be supplied to the oxide semiconductor film 108 by solid-phase diffusion due to heat treatment performed in the manufacturing process of the transistor. By the treatment for introducing the oxygen 145, oxygen may be introduced into the oxide semiconductor film 108 through the first insulating film 114a.

Figure 4D:
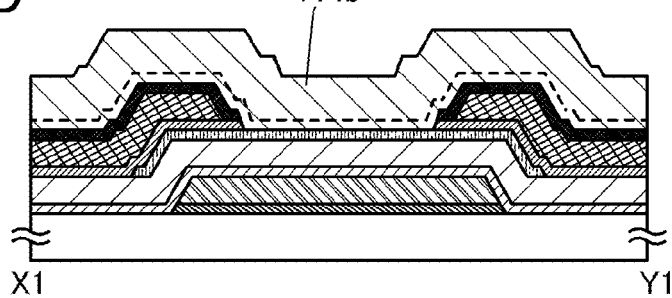

Next, the second insulating film 114b is formed over the first insulating film 114a (see FIG. 4D).

The second insulating film 114b can be formed by a plasma CVD method or a sputtering method, using a silicon oxide film, a gallium oxide film, an aluminum oxide film, a silicon nitride film, a silicon oxynitride film, an aluminum oxynitride film, or a silicon nitride oxide film. The thickness of the second insulating film 114b is preferably greater than or equal to 50 nm and less than or equal to 500 nm.

In this embodiment, as the second insulating film 114b, a 370-nm-thick silicon oxynitride film is formed by a plasma CVD method. The conditions for forming the second insulating film 114b can be as follows: for example, the gas flow rate ratio of $SiH_4$ to $N_2O$ is 30 sccm:4000 sccm; the pressure is 200 Pa; the RF power supply (power supply output) is 150 W; and the substrate temperature is 220° C.±15° C.

In the case where the first insulating film 114a and the second insulating film 114b are formed using the same kind of material, the interface between the first insulating film 114a and the second insulating film 114b cannot be clearly defined in some cases. Accordingly, in this embodiment, the interface between the first insulating film 114a and the second insulating film 114b is shown by a dotted line.

Note that like the first insulating film 114a, the second insulating film 114b preferably contains impurities such as water or hydrogen as little as possible. Thus, in this embodiment, after formation of the second insulating film 114b, heat treatment for removing hydrogen atoms (for dehydration or dehydrogenation) is performed thereon.

The temperature of heat treatment can be, for example, higher than or equal to 250° C. and lower than or equal to 600° C., preferably higher than or equal to 300° C. and lower than or equal to 600° C. In this embodiment, heat treatment is performed at 350° C. for one hour.

Figure 5A:
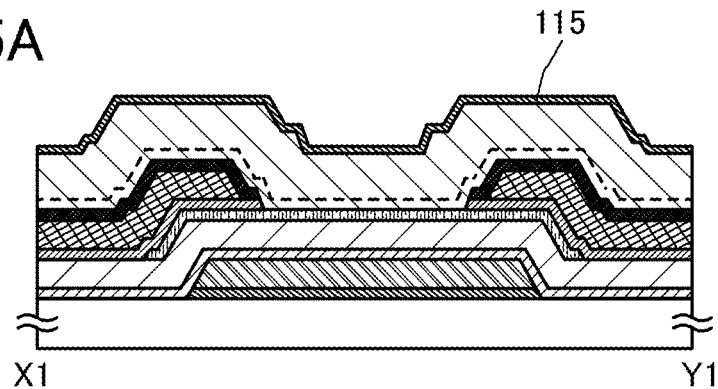
FIGS. 5A to 5C are cross-sectional views illustrating an example of the manufacturing process of the semiconductor device.
Figure 5B:
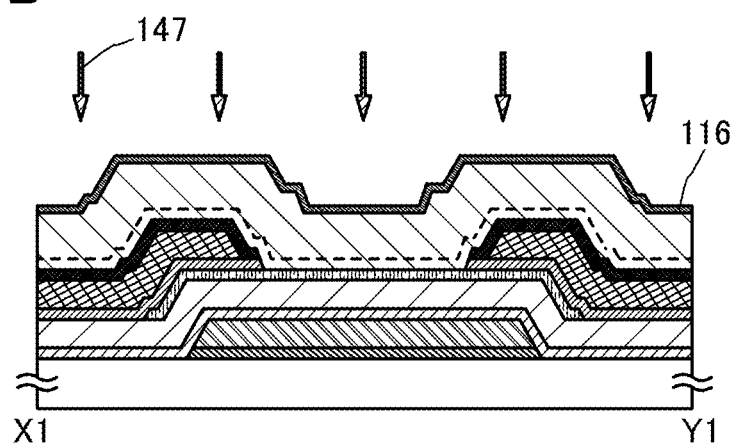

Next, an aluminum film 115 is formed over the second insulating film 114b (see FIG. 5A).

The aluminum film 115 is preferably formed by a sputtering method, an evaporation method, a CVD method, or the like. The thickness of the aluminum film 115 is preferably greater than or equal to 3 nm and less than or equal to 10 nm. In this embodiment, a 5-nm-thick aluminum film is formed by a sputtering method.

The aluminum film 115 formed over the second insulating film 114b becomes an aluminum oxide film by being subjected to oxygen-introducing treatment in a later step, and functions as a barrier film in the transistor. The aluminum oxide film has a high shielding effect (blocking effect) of preventing penetration of both oxygen and impurities such as hydrogen or water into the transistor, i.e., has barrier properties.

Next, oxygen 147 is introduced into the aluminum film 115. Thus, the aluminum film 115 becomes the aluminum oxide film 116 (see FIG. 5B).

The oxygen 147 can be introduced in a manner similar to that of the oxygen 145.

Further, by the treatment for introducing the oxygen 147, oxygen may be introduced into part of the second insulating film 114b through the aluminum film 115. Thus, in the second insulating film 114b, oxygen can be contained to compensate for oxygen which has been possibly released by the above heat treatment, and a region containing oxygen in excess of the stoichiometric composition can be formed. Note that such a region containing oxygen in excess of the stoichiometric composition exists in at least part of the second insulating film 114b. The depth at which oxygen is implanted may be adjusted as appropriate by implantation conditions.

Further, in the aluminum oxide film 116, a region containing oxygen in excess of the stoichiometric composition may be formed. Note that the aluminum oxide film 116 formed by the oxygen-introducing treatment does not need to contain oxygen equivalent to the stoichiometric composition other than the region and may have some conductivity. For example, in the case where the composition of the aluminum oxide film is represented by $Al_2O_x$, x is preferably greater than or equal to 1 and less than or equal to 3.5. Further, in the case where the aluminum oxide film 116 has conductivity, the resistivity $\rho$ is preferably greater than or equal to $10^{10}$ Ω·m and less than or equal to $10^{19}$ Ω·m, further preferably greater than or equal to $10^{10}$ Ω·m and less than or equal to $10^{18}$ Ω·m, still further preferably greater than or equal to $10^{11}$ Ω·m and less than or equal to $10^{15}$ Ω·m. When the aluminum oxide film 116 has resistivity in the above range, the transistor 150 can be prevented from being damaged by electrostatic discharge.

In addition, the aluminum oxide film 116 is a film obtained by oxidizing the aluminum film 115. Formation of the aluminum oxide film 116 by oxidation of the aluminum film 115 can increase productivity as compared with the case where an aluminum oxide film is deposited by a sputtering method.

Note that after introducing the oxygen 147 into the aluminum film 115, heat treatment may be performed. By the heat treatment, oxygen contained in the first insulating film 114a or the second insulating film 114b is supplied to the oxide semiconductor film 108, whereby oxygen vacancies in the oxide semiconductor film 108 may be filled. The temperature of the heat treatment can be, for example, higher than or equal to 250° C. and lower than or equal to 600° C., preferably higher than or equal to 300° C. and lower than or equal to 600° C. In this embodiment, heat treatment is performed at 300° C. for one hour.

Figure 5C:
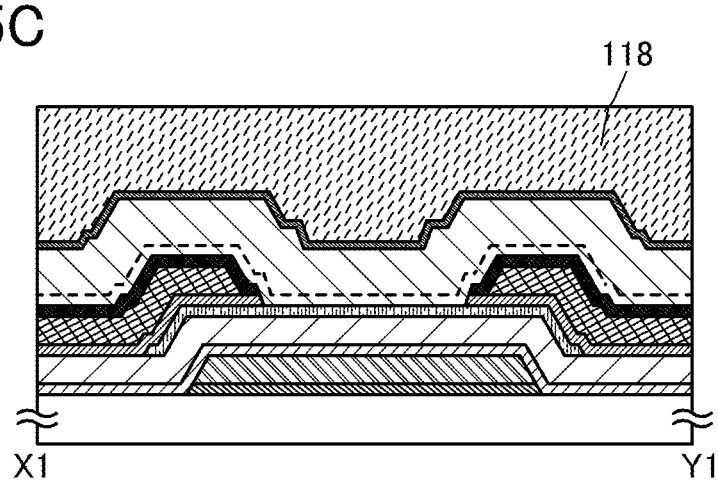

Next, the planarization insulating film 118 is formed over the aluminum oxide film 116 (see FIG. 5C).

The planarization insulating film 118 can planarize the unevenness of the transistor 150. For the planarization insulating film 118, for example, a heat-resistant organic material such as a polyimide-based resin, an acrylic-based resin, a polyimide amide-based resin, a benzocyclobutene-based resin, a polyamide-based resin, or an epoxy-based resin can be used. Other than such organic materials, a low-dielectric constant material (a low-k material), a siloxane-based resin, or the like can be used. Note that the planarization insulating film 118 may be formed by stacking a plurality of insulating films formed using any of these materials. In this embodiment, an acrylic-based resin film with a thickness of 1.5 µm is used as the planarization insulating film 118.

As described above, in the transistor 150 in this embodiment, the oxide semiconductor film is used for the channel formation region, and copper which is a low resistance material is used for the gate electrode, the source electrode, and the drain electrode. Further, when the source electrode and the drain electrode are formed, the back channel side of the oxide semiconductor film is not in contact with the copper film; thus, it is possible to prevent the copper element from being attached or diffused in the oxide semiconductor film. In addition, the gate electrode, the source electrode, and the drain electrode each use a copper film and have a barrier metal which can prevent diffusion of the copper element. Therefore, a transistor with stable electric characteristics and little signal delay due to wiring resistance can be provided.

The methods and structures described in this embodiment can be combined as appropriate with any of the methods and structures described in the other embodiments.

Embodiment 2

In this embodiment, a modification example of the semiconductor device in Embodiment 1 and a method for manufacturing a semiconductor device, which is different from that in Embodiment 1, will be described with reference to FIGS. 6A and 6B, FIGS. 7A to 7D, and FIGS. 8A to 8D. Note that portions similar to those in FIGS. 1A to 1C, FIGS. 2A to 2E, FIGS. 3A to 3D, FIGS. 4A to 4D, and FIGS. 5A to 5C are denoted by the same reference numerals, and description thereof is omitted.

Structural Example 2 of Semiconductor Device

Figure 6A:
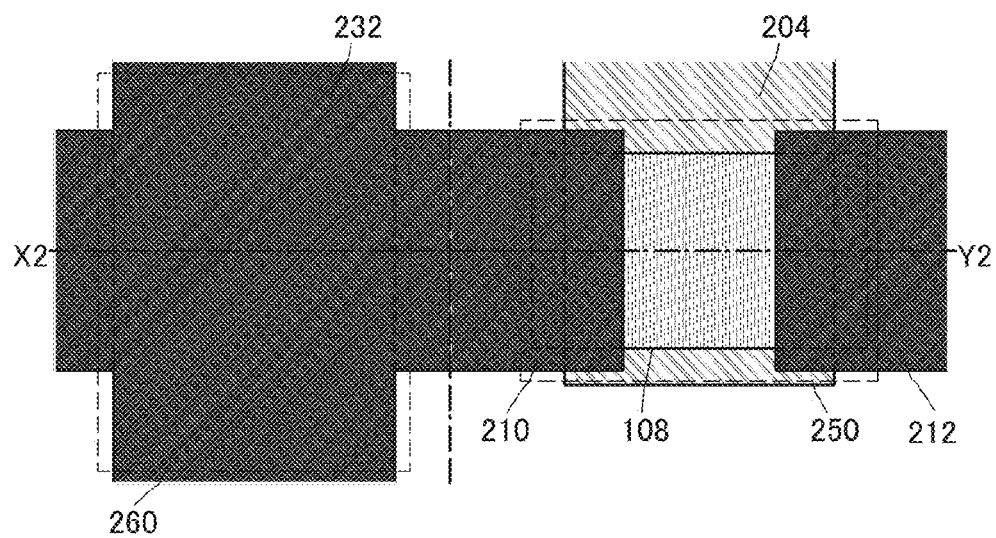
FIG. 6A is a plan view of one embodiment of a semiconductor device and FIG. 6B is a cross-sectional view thereof.
Figure 6B:
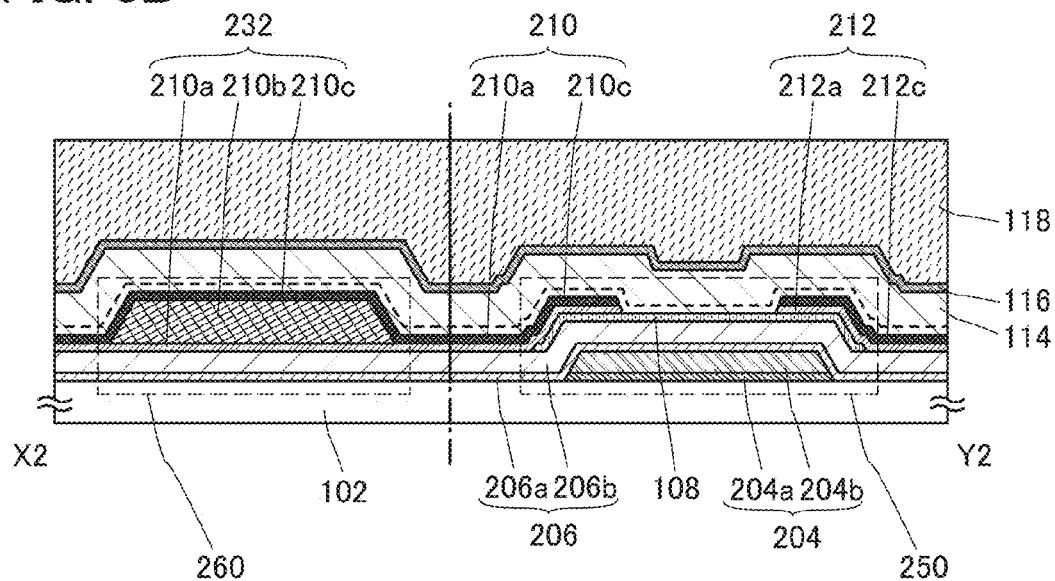

FIGS. 6A and 6B illustrate a structural example of a transistor 250 and a signal line region 260. FIG. 6A is a plan view of the transistor 250 and the signal line region 260. FIG. 6B is a cross-sectional view taken along the line X2-Y2 in FIG. 6A. Note that in FIG. 6A, some components of the transistor 250 and the signal line region 260 (e.g., a gate insulating film 206 and a second metal film 210b) are omitted to avoid complexity.

A semiconductor device illustrated in FIGS. 6A and 6B includes a gate electrode 204 formed over the substrate 102, a gate insulating film 206 formed over the gate electrode 204, the oxide semiconductor film 108 formed in contact with the gate insulating film 206 and in a position which overlaps with the gate electrode 204, a source electrode 210 and a drain electrode 212 formed over the oxide semiconductor film 108, and a signal line 232 electrically connected to the source electrode 210. The signal line 232 includes a first metal film 210a, a second metal film 210b and a third metal film 210c. The second metal film 210b is formed in the inner region of the end portions of the first metal film 210a and the third metal film 210c. The source electrode 210 includes the first metal film 210a and the third metal film 210c. The drain electrode 212 includes the first metal film 212a and the third metal film 212c.

The gate electrode 204 includes a first gate electrode 204a and a second gate electrode 204b. As the first gate electrode 204a, a metal film or a metal nitride film containing one or more elements selected from tungsten, tantalum, titanium, and molybdenum is preferably used. The second gate electrode 204b preferably contains a copper element. For example, in this embodiment, a tungsten film is used as the first gate electrode 204a and a copper film is used as the second gate electrode 204b. With such a stacked-layer structure, the gate electrode 204 can have low resistance. By providing the first gate electrode 204a, adhesion between the substrate 102 and the copper film used as the second gate electrode 204b can be improved and/or diffusion of the copper element in the copper film used as the second gate electrode 204b can be prevented.

The gate insulating film 206 includes a first gate insulating film 206a and a second gate insulating film 206b. The first gate insulating film 206a may at least have a function of preventing diffusion of the copper element in the copper film used as the second gate electrode 204b. As the first gate insulating film 206a, a silicon nitride film, a silicon nitride oxide film, an aluminum oxide film, an aluminum nitride oxide film, or the like can be used. The second gate insulating film 206b may at least have a function of supplying oxygen to the oxide semiconductor film 108 to be formed later. As the second gate insulating film 206b, a silicon oxide film, a silicon oxynitride film, or the like can be used. For example, in this embodiment, a silicon nitride film is used as the first gate insulating film 206a, and a silicon oxynitride film is used as the second gate insulating film 206b. With the gate insulating film 206 having such a stacked-layer structure, diffusion of the copper element in the copper film used as the gate electrode 204 can be prevented and oxygen can be supplied to the oxide semiconductor film 108 to be formed later.

As the first metal film 210a, the first metal film 212a, the third metal film 210c, and the third metal film 212c, a metal film or a metal nitride film containing one or more elements selected from tungsten, tantalum, titanium, and molybdenum is preferably used.

For example, in this embodiment, a tungsten film is used as the first metal film 210a and the first metal film 212a and a tantalum nitride film is used as the third metal film 210c and the third metal film 212c.

The second metal film 210b preferably contains a copper element. In this embodiment, a copper film is used as the second metal film 210b.

As described above, the structures of the source electrode 210 and the drain electrode 212 used for the transistor 250 are different from the structure of the signal line 232. By electrically connecting the source electrode 210 and the drain electrode 212 to the signal line 232 including a copper film, signal delay and the like due to wiring resistance can be suppressed. Moreover, with the structure where a material including a copper element is not used in the source electrode 210 and the drain electrode 212 used for the transistor 250, the copper element which might be diffused into the oxide semiconductor film 108 can be disposed away from the oxide semiconductor film 108, which is effective. Furthermore, the signal line 232, the source electrode 210, and the drain electrode 212 can be manufactured in the same steps of a semiconductor manufacturing process; thus, an excellent effect of reducing manufacturing cost is obtained.

Next, a method for manufacturing the transistor 250 and the signal line region 260 illustrated in FIGS. 6A to 6B will be described with reference to FIGS. 7A to 7D and FIGS. 8A to 8D.

Method 2 for Manufacturing Semiconductor Device

First, the gate electrode 204, the gate insulating film 206, and the oxide semiconductor film 108 are formed over the substrate 102. Note that referring to the process of FIGS. 2A to 2D in Embodiment 1, the gate electrode 204, the gate insulating film 206, and the oxide semiconductor film 108 can be formed. Then, a first metal film 209a and a second metal film 209b that are to serve as the source electrode, the drain electrode, and the signal line are formed over the gate insulating film 206 and the oxide semiconductor film 108 (see FIG. 7A).

The first metal film 209a is preferably a metal film or a metal nitride film containing one or more elements selected from tungsten, tantalum, titanium, and molybdenum. In this embodiment, as the first metal film 209a, a 50-nm-thick tungsten film formed by a sputtering method is used.

Further, the first metal film 209a may have a stacked-layer structure. For example, the stacked-layer structure of the first metal film 209a includes a metal film containing one or more elements selected from tungsten, tantalum, titanium, and molybdenum as a first layer, and a metal nitride film containing one or more elements selected from tungsten nitride, tantalum nitride, titanium nitride and molybdenum nitride as a second layer.

For the first metal film 209a, since the first metal film 209a is in contact with the oxide semiconductor film 108, a material which does not extract oxygen from the oxide semiconductor film 108 and does not make the oxide semiconductor film 108 have n-type conductivity, or a material which is not diffused into the oxide semiconductor film 108 and does not make the oxide semiconductor film 108 have n-type conductivity is used. In addition, a material which prevents diffusion of a copper element from a copper film used as the second metal film 209b to the oxide semiconductor film 108 is preferably used for the first metal film 209a.

The second metal film 209b preferably contains a copper element. Note that a copper alloy or the like in which aluminum, gold, silver, zinc, tin, nickel or the like is added at several weight percent to copper may be used. In this embodiment, as the second metal film 209b, a 200-nm-thick copper film formed by a sputtering method is used.

Figure 7A:
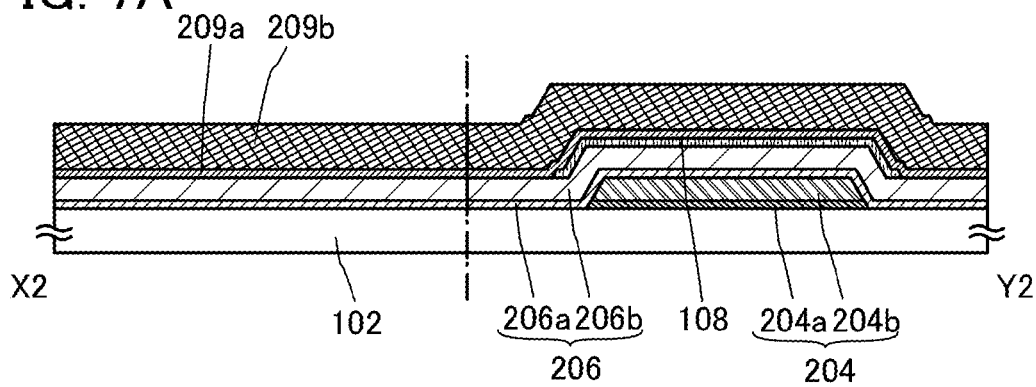
FIGS. 7A to 7D are cross-sectional views illustrating an example of a manufacturing process of a semiconductor device.
Figure 7B:
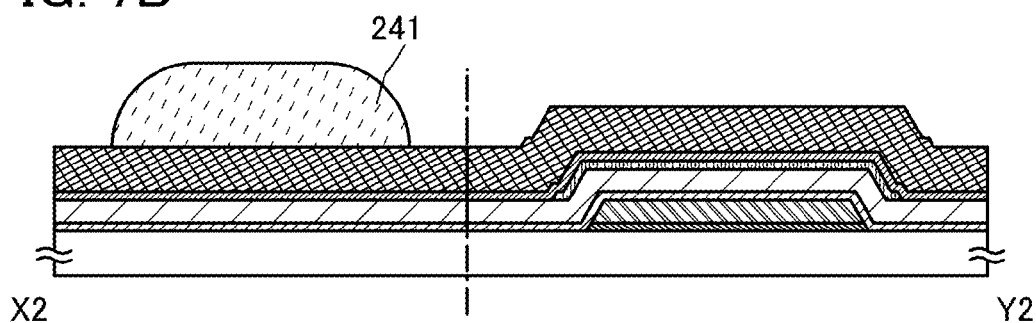

Next, a resist is applied over the second metal film 209b, and the first patterning is performed, whereby a resist mask 241 is formed (see FIG. 7B).

The resist mask 241 can be formed using a material and a method similar to those of the resist mask 141 in Embodiment 1.

Figure 7C:
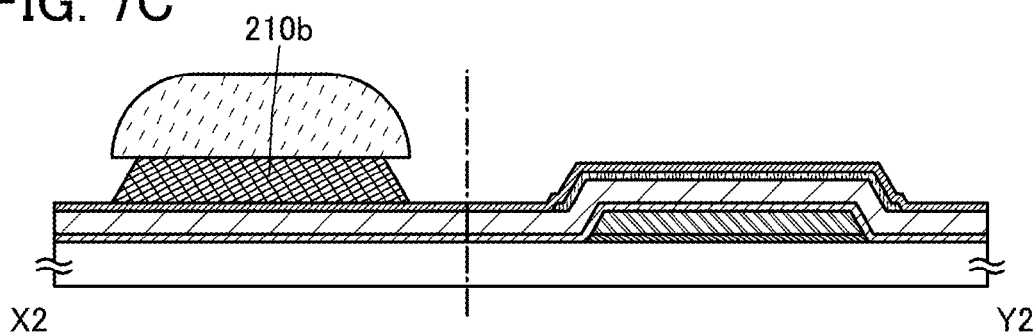

Next, the second metal film 209b is partly removed by the first etching, whereby the second metal film 210b is formed (see FIG. 7C).

As a method for removing the second metal film 209b, a wet etching method is preferable. As a chemical solution used in the wet etching method, it is preferable that a chemical solution which can etch the second metal film 209b and does not remove the first metal film 209a be used. For example, in the case where a tungsten film is used as the first metal film 209a and a copper film is used as the second metal film 209b, a mixed solution of water, hydrogen peroxide water, and carboxylic acid; a mixed solution of water, phosphoric acid, nitric acid, sulfuric acid, and potassium sulfate; or the like can be used as a chemical solution.

Moreover, isotropic etching may be performed by adjusting a wet etching time so that the side surfaces of the second metal film 210b may be receded to be at the inner side of the side surfaces of the resist mask 241.

In this manner, when the first etching is performed, the second metal film 209b in the signal line region 260 is left and the second metal film 209b is removed from a region where the oxide semiconductor film 108 is formed.

Figure 7D:
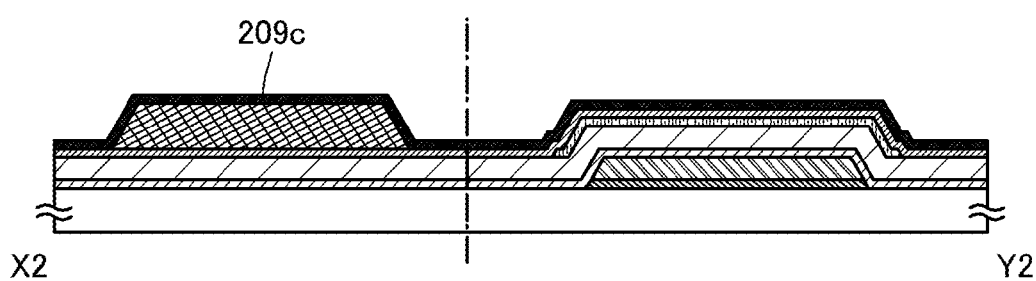

Next, the resist mask 241 is removed, whereby the third metal film 209c is formed over the first metal film 209a and the second metal film 210b (see FIG. 7D).

Note that the resist mask 241 can be removed by a method similar to that of the resist mask 141 in Embodiment 1.

The third metal film 209c can be formed using a method and a material similar to those of the first metal film 209a.

Note that in this embodiment, as the third metal film 209c, a 100-nm-thick tantalum nitride film formed by a sputtering method is used.

Figure 8A:
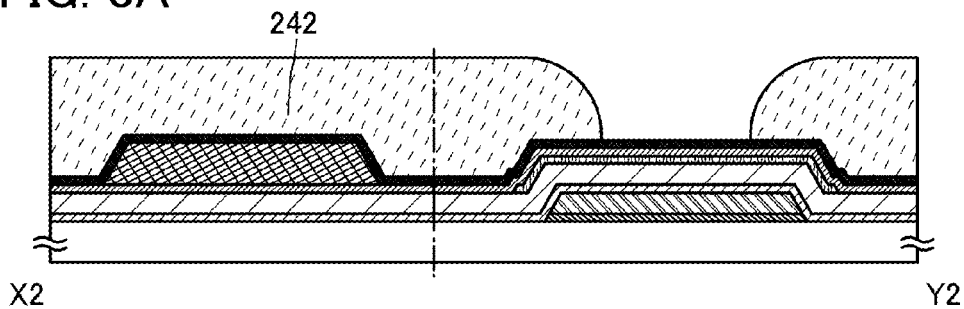
FIGS. 8A and 8D are cross-sectional views illustrating an example of the manufacturing process of the semiconductor device.

Next, a resist is applied over the third metal film 209c, and the second patterning is performed, whereby a resist mask 242 is formed (see FIG. 8A).

The resist mask 242 can be formed using a material and a method similar to those of the resist mask 241.

Figure 8B:
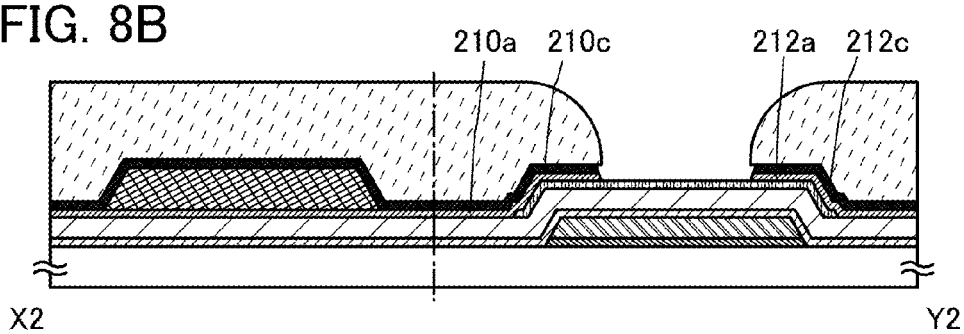
Figure 8C:
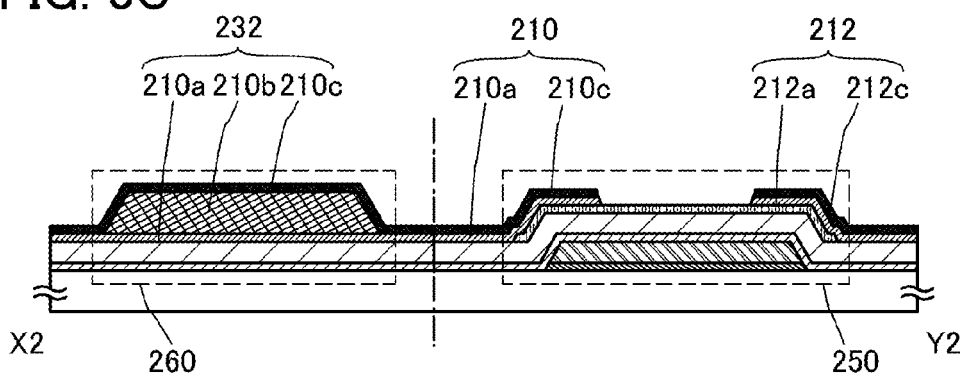

Next, the first metal film 209a and the third metal film 209c is partly removed by the second etching, whereby the first metal film 210a, the first metal film 212a, the third metal film 210c, and the third metal film 212c are formed (see FIG. 8B).

Note that the first metal film 209a and the third metal film 209c are partly removed by the second etching so that the removed portions are at the outer side of the end portions of the second metal film 210b which is removed by the first etching.

As a method for removing the first metal film 209a and the third metal film 209c, a dry etching method is preferably used. As a gas used for a dry etching method, in the case where a tungsten film is used as the first metal film 209a and a tantalum nitride film is used as the third metal film 209c, a mixed gas containing $SF_6$ and $O_2$, a mixed gas containing $SF_6$ and $BCl_3$, or the like can be used, for example.

Note that it is desirable that etching conditions be optimized so as not to etch and divide the oxide semiconductor film 108 when the first metal film 209a and the third metal film 209c are etched. However, it is difficult to obtain etching conditions in which only the first metal film 209a and the third metal film 209c are etched and the oxide semiconductor film 108 is not etched at all. In some cases, when the first metal film 209a and the third metal film 209c are etched, the oxide semiconductor film 108 is partly etched to have a groove portion (a recessed portion).

Next, the resist mask 242 is removed, whereby the source electrode 210 including the first metal film 210a and the third metal film 210c, and the drain electrode 212 including the first metal film 212a and the third metal film 212c are formed. Further, in the signal line region 260, the signal line 232 including the first metal film 210a, the second metal film 210b, and the third metal film 210c is formed (see FIG. 8C).

In this manner, the signal line 232 which uses a copper film as the second metal film 210b, and the source electrode 210 and the drain electrode 212 which do not include the second metal film 210b can be formed in the same steps.

Note that the resist mask 242 can be removed by a method similar to that of the resist mask 241.

Further, after the signal line 232, the source electrode 210, and the drain electrode 212 are formed, the oxide semiconductor film 108 (more specifically, the back channel side thereof) is preferably cleaned. The oxide semiconductor film 108 is effectively cleaned by oxygen plasma treatment, cleaning treatment by treatment with dilute hydrofluoric acid, or the like. By performing such a cleaning, an etching gas component used in forming the source electrode 210 and the drain electrode 212, a residue of the resist mask 242, or the like can be removed from the oxide semiconductor film 108, so that the oxide semiconductor film 108 can be more purified.

Further, after the signal line 232, the source electrode 210, and the drain electrode 212 are formed, heart treatment may be performed. The heat treatment is performed at a temperature higher than or equal to 250° C. and lower than or equal to 650° C., preferably higher than or equal to 450° C. and lower than or equal to 600° C., or lower than the strain point of the substrate.

Through the above process, the transistor 250 and the signal line region 260 in this embodiment are formed.

Figure 8D:
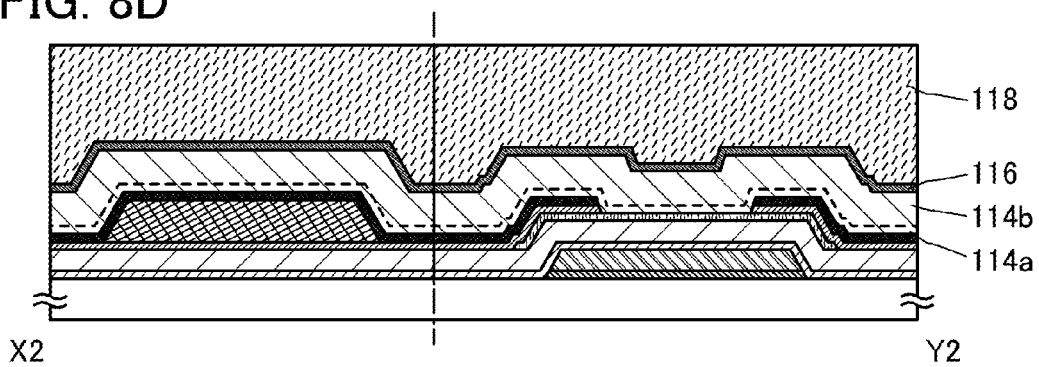

Next, the first insulating film 114a, the second insulating film 114b, the aluminum oxide film 116, and the planarization insulating film 118 are formed over the transistor 250 and the signal line region 260 (see FIG. 8D).

Referring to the process in Embodiment 1, the first insulating film 114a, the second insulating film 114b, the aluminum oxide film 116, and the planarization insulating film 118 can be formed.

As described above, the structures of the source electrode 210 and the drain electrode 212 of the transistor 250 are different from the structure of the signal line 232 of the signal line region 260. By electrically connecting the source electrode 210 and the drain electrode 212 to the signal line 232 using the copper film, signal delay and the like due to wiring resistance can be suppressed. Moreover, with the structure where a material including a copper element is not used in the source electrode 210 and the drain electrode 212 used for the transistor 250, the copper element which might be diffused into the oxide semiconductor film 108 can be disposed away from the oxide semiconductor film 108, which is effective. Furthermore, the signal line 232, the source electrode 210 and the drain electrode 212 can be manufactured in the same steps of a semiconductor manufacturing process; thus, an excellent effect of reducing manufacturing cost is obtained.

The methods and structures described in this embodiment can be combined as appropriate with any of the methods and structures described in the other embodiments.

Embodiment 3

A display device with a display function can be manufactured using the transistor exemplified in Embodiment 1 or Embodiment 2 and the signal line exemplified in Embodiment 2. Moreover, some or all of the driver circuits which include the transistor can be formed over a substrate where the pixel portion is formed, whereby a system-on-panel can be obtained. An example of the display device will be described with reference to FIG. 9.

Figure 9:
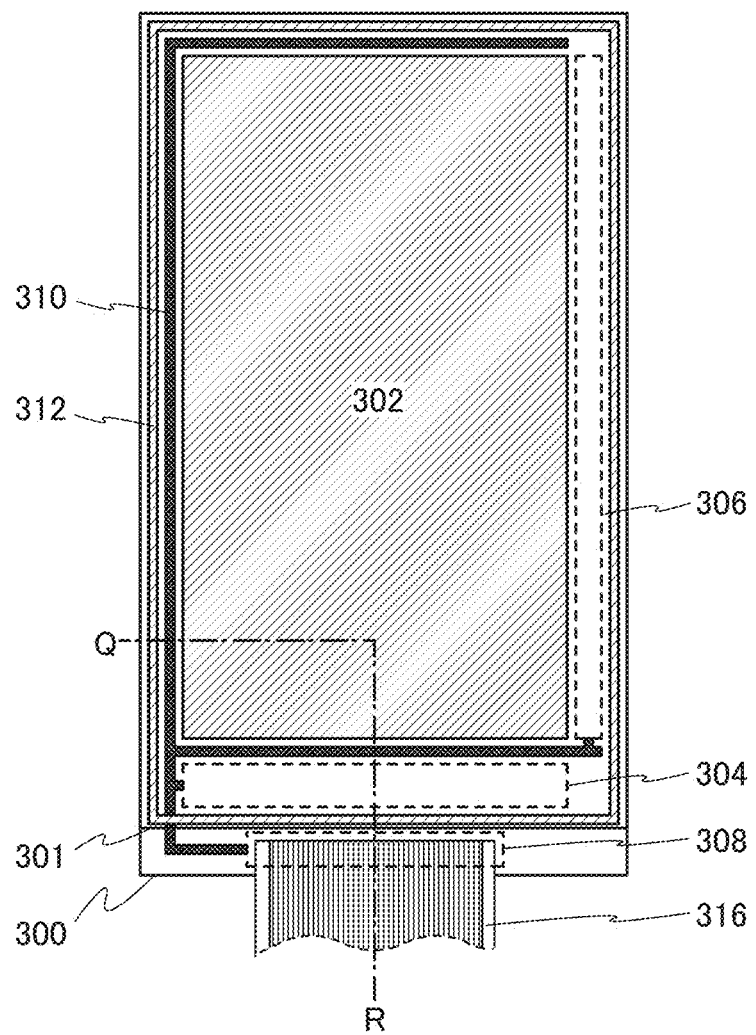
FIG. 9 is a plan view illustrating one embodiment of a display device.

In FIG. 9, a sealant 312 is provided so as to surround a pixel portion 302, a source driver circuit portion 304, and a gate driver circuit portion 306 which are provided over a first substrate 300. The second substrate 301 is provided over the pixel portion 302, the source driver circuit portion 304, and the gate driver circuit portion 306. Thus, the pixel portion 302, the source driver circuit portion 304, and the gate driver circuit portion 306 are sealed together with a display element by the first substrate 300, the sealant 312, and the second substrate 301.

In FIG. 9, a flexible printed circuit (FPC) terminal portion 308 which is electrically connected to the pixel portion 302, the source driver circuit portion 304, and the gate driver circuit portion 306 is provided in a region over the first substrate 300 that is different from the region surrounded by the sealant 312. An FPC 316 is connected to the FPC terminal portion 308. Signals and potentials applied to the pixel portion 302, the source driver circuit portion 304, and the gate driver circuit portion 306 are supplied through the FPC 316.

Further, in FIG. 9, a signal line 310 is connected to the pixel portion 302, the source driver circuit portion 304, the gate driver circuit portion 306, and FPC terminal portion 308. Signals and potentials are applied to the pixel portion 302, the source driver circuit portion 304, the gate driver circuit portion 306, and the FPC terminal portion 308 via the signal line 310 from the FPC 316.

In FIG. 9, an example in which the source driver circuit portion 304 and the gate driver circuit portion 306 are formed over the first substrate 300 where the pixel portion 302 is also formed is described; however, the structure is not limited thereto. For example, only the gate driver circuit portion 306 may be formed over the first substrate 300 or only the source driver circuit portion 304 may be formed over the first substrate 300. In this case, a substrate which is separately prepared and where a source driver circuit, a gate driver circuit, or the like is formed (e.g., a driver-circuit substrate formed using a single-crystal semiconductor film or a polycrystalline semiconductor film) may be mounted on the first substrate 300.

The connection method of such a separately formed driver circuit substrate is not particularly limited; for example, a chip on glass (COG) method, a wire bonding method, or a tape automated bonding (TAB) method can be used.

The display device includes, in its category, a panel in which a display element is sealed, and a module in which an IC or the like including a controller is mounted on the panel.

Note that a display device in this specification means an image display device, a display device, or a light source (including a lighting device). Further, the display device includes any of the following modules in its category: a module including a connector such as an FPC, a TAB tape, or tape carrier package (TCP); a module including a TAB tape or a TCP which is provided with a printed wiring board at the end thereof; and a module including a driver circuit substrate or an IC which is directly mounted on a display element by a COG method. In addition, the pixel portion 302, the source driver circuit portion 304, and the gate driver circuit portion 306 provided over the first substrate 300 each include a plurality of transistors. The plurality of transistors can be the transistors exemplified in Embodiments 1 and 2. In this embodiment, the case where the transistor exemplified in Embodiment 2 is applied will be described.

In addition, as a display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 10:
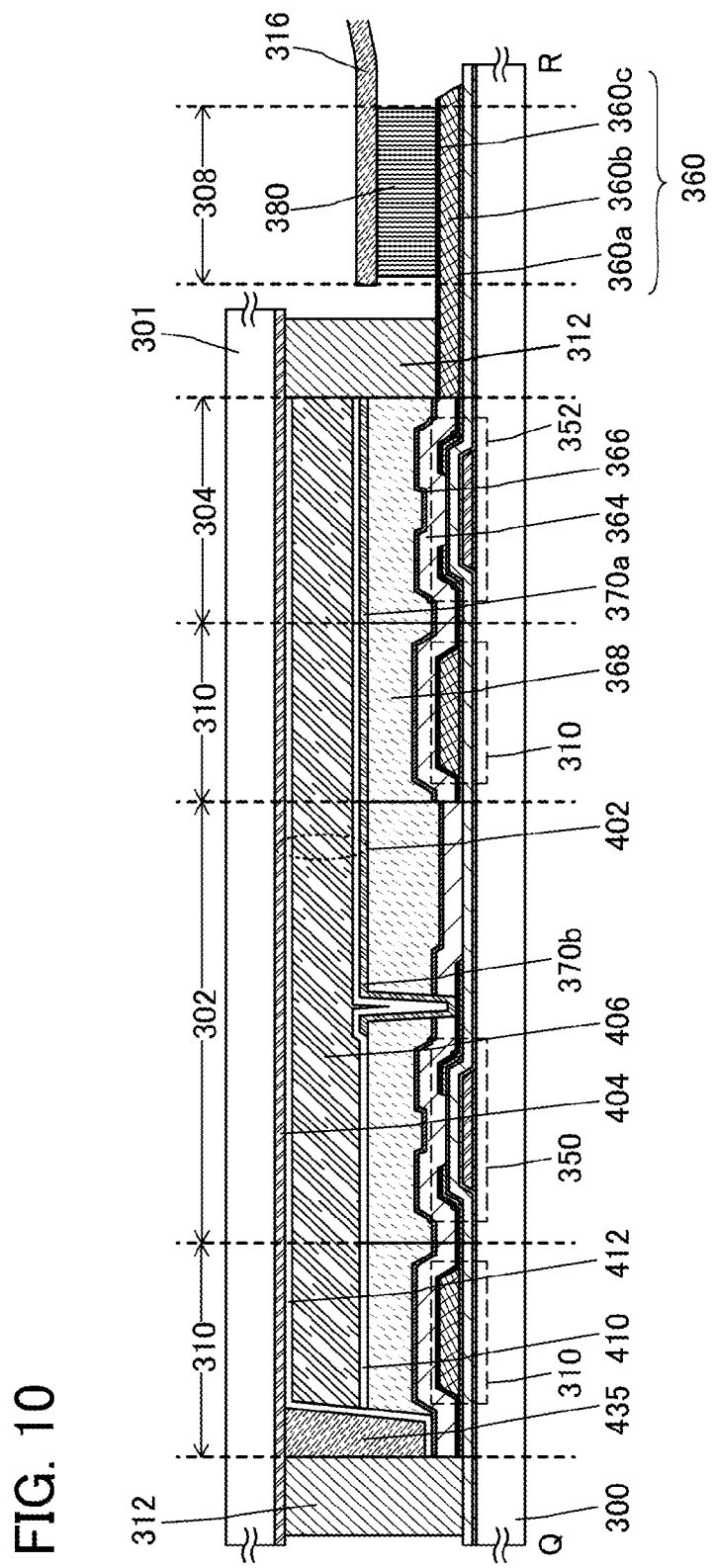
FIG. 10 is a cross-sectional view illustrating one embodiment of a display device.
Figure 11:
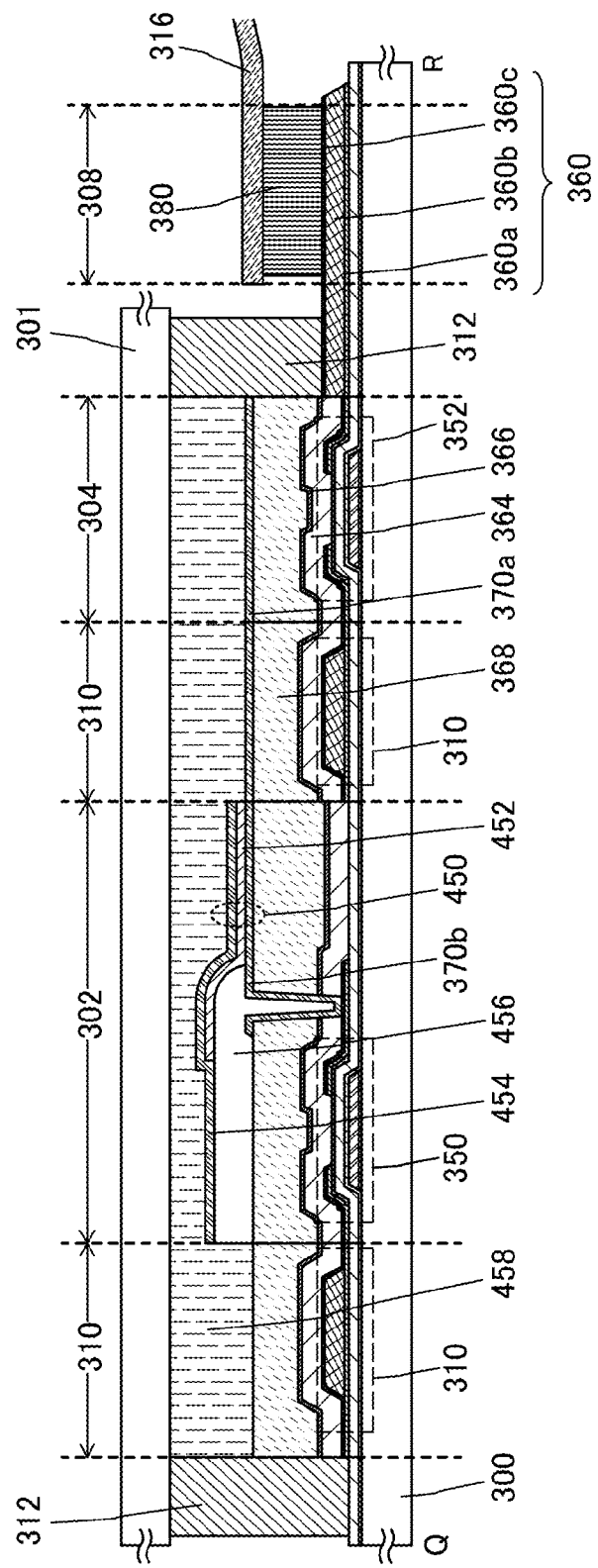
FIG. 11 is a cross-sectional view illustrating one embodiment of a display device.

Embodiments of the display elements provided in display devices are described with reference to FIG. 10 and FIG. 11. FIG. 10 and FIG. 11 each correspond to a cross-sectional view of a display device taken along the dotted line Q-R in FIG. 9.

In the display device illustrated in FIG. 10, the FPC terminal portion 308 provided over the first substrate 300 includes a terminal electrode 360 including a first metal film 360a, a second metal film 360b, and a third metal film 360c. The terminal electrode 360 is electrically connected to a terminal of the FPC 316 via an anisotropic conductive film 380.

The terminal electrode 360 is formed through the same steps as source electrodes and drain electrodes of a transistor 350 and a transistor 352 and the signal line 310.

Further, the pixel portion 302 and the source driver circuit portion 304 over the first substrate 300 include a plurality of transistors. As the plurality of transistors, the transistor 350 included in the pixel portion 302 and the transistor 352 included in the source driver circuit portion 304 are exemplified in FIG. 10 and FIG. 11.

Note that in this embodiment, the transistor 350 included in the pixel portion 302 and the transistor 352 included in the source driver circuit portion 304 have in the same size; however, this embodiment is not limited to this. The transistor used in the pixel portion 302 and the transistor used in the source driver circuit portion 304 can be appropriately changed in size (L/W) or in the transistor count. The gate driver circuit portion 306 is not illustrated in FIG. 10 and FIG. 11; however, the gate driver circuit portion 306 can have a structure similar to that of the source driver circuit portion 304. Note that the portion to which the gate driver circuit portion 306 is connected, the connecting method, and the like are different from those of the source driver circuit portion 304.

Further, the transistor 350, the transistor 352, and the signal line 310 in FIG. 10 and FIG. 11 can have the structures similar to those of the transistor 250 and the signal line 232 in Embodiment 2.

That is, the transistor 350 and the transistor 352 each have the source electrode and the drain electrode including the first metal film and the third metal film, and the signal line 310 has a wiring including the first metal film, the second metal film, and the third metal film. The first metal film and the third metal film are a metal film or a metal nitride film containing one or more elements selected from tungsten, tantalum, titanium, and molybdenum. The second metal film is formed using a material containing a copper element.

Moreover, the terminal electrode 360 has a structure similar to that of the signal line 310 and is formed using the first metal film, the second metal film, and the third metal film.

As described above, the source electrodes and the drain electrodes in the transistor 350 and the transistor 352 are formed without using a copper film, and the signal line 310 and the terminal electrode 360 are formed using a copper film. By using the transistor 350, the transistor 352, the signal line 310, and the terminal electrode 360, a display device having stable electric characteristics and including low-resistance electrodes and wirings can be provided.

Further, in FIG. 10 and FIG. 11, an insulating film 364, a protective insulating film 366, and a planarization insulating film 368 are provided over the transistor 350 and the transistor 352.

In this embodiment, a silicon oxynitride film is used as the insulating film 364, and an aluminum oxide film is used as the protective insulating film 366. Note that the insulating film 364 and the protective insulating film 366 can be formed by a sputtering method or a plasma CVD method.

The silicon oxynitride film provided as the insulating film 364 is provided in contact with the oxide semiconductor film and can supply oxygen to the oxide semiconductor film.

The aluminum oxide film provided as the protective insulating film 366 has a high shielding effect (blocking effect) of preventing penetration of both oxygen and impurities such as hydrogen and water. Therefore, in and after the manufacturing process, the aluminum oxide film functions as a protective film for preventing entry of an impurity such as hydrogen or water, which causes a change, into the oxide semiconductor film and release of oxygen, which is a main constituent material of the oxide semiconductor film, from the oxide semiconductor film.

Further, the planarization insulating film 368 can be formed using an organic material having heat resistance, such as a polyimide-based resin, an acrylic-based resin, a polyimide amide-based resin, a benzocyclobutene-based resin, a polyamide-based resin, or an epoxy-based resin. Note that the planarization insulating film 368 may be formed by stacking a plurality of insulating films formed using these materials.

Further, the display device in this embodiment has a structure in which the planarization insulating film 368 is provided over the transistor 352 included in the source driver circuit portion 304 and the conductive film 370a is provided over the planarization insulating film 368 to overlap with a channel formation region of the oxide semiconductor film. However, without limitation to this structure, the conductive film 370a is not necessarily provided. By providing the conductive film 370a so as to overlap with the channel formation region of the oxide semiconductor film, the amount of change in the threshold voltage of the transistor 352 between before and after the BT test can be reduced. Potential of the conductive film 370a may be the same as or different from that of a gate electrode of the transistor 352. The conductive film 370a can also function as a second gate electrode. The potential of the conductive film 370a may be GND or 0 V, or the conductive film 370a may be in a floating state.

Note that the conductive film 370a has a function of blocking an external electric field (particularly, to block static electricity), that is, to prevent an external electric field from acting on the inside (a circuit portion including the transistor 352). Such a blocking function of the conductive film 370a can prevent variation in electric characteristics of the transistor 352 due to the influence of an external electric field such as static electricity. Note that the conductive film 370a may be formed in a wide range of area so as to overlap with the transistor 352. Accordingly, the function of blocking static electricity is further improved.

The display device in this embodiment has a structure in which the planarization insulating film 368 is provided over the transistor 350 included in the pixel portion 302 and the conductive film 370b in contact with the source electrode or the drain electrode is provided over the planarization insulating film 368. The conductive film 370b serves as a pixel electrode in the pixel portion 302.

The transistor 350 included in the pixel portion 302 is electrically connected to a display element to form a display panel. A variety of display elements can be used as the display element as long as display can be performed.

An example of a liquid crystal display device using a liquid crystal element as a display element is illustrated in FIG. 10. In FIG. 10, a liquid crystal element 402 which is a display element includes the conductive film 370b, a counter electrode 404, and a liquid crystal layer 406. An insulating film 410 and an insulating film 412 serving as alignment films are provided so that the liquid crystal layer 406 is interposed therebetween. The counter electrode 404 is provided on the second substrate 301 side and stacked over the conductive film 370b with the liquid crystal layer 406 provided therebetween.

A spacer 435 is a columnar spacer obtained by selective etching of an insulating film and is provided in order to control the thickness (a cell gap) of the liquid crystal layer 406. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal showing a blue phase and a chiral agent has a short response time and has optical isotropy, which makes the alignment process unneeded and the viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor film has a possibility that the electric characteristics of the transistor may vary significantly by the influence of static electricity and deviate from the designed range. Therefore, it is more effective to use a liquid crystal material exhibiting a blue phase for the liquid crystal display device including the transistor that includes the oxide semiconductor film.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor film which is highly purified and in which formation of an oxygen vacancy is suppressed, it is enough to provide a storage capacitor having a capacitance that is ⅓ or less, preferably ⅕ or less of liquid crystal capacitance of each pixel.

In the transistor used in this embodiment, which includes an oxide semiconductor film which is highly purified and in which formation of an oxygen vacancy is suppressed, the current in an off state (off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

The transistor used in this embodiment, which includes an oxide semiconductor film which is highly purified and in which formation of an oxygen vacancy is suppressed, can have relatively high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

Further, a wiring containing a copper element is used as a signal line connected to a switching transistor in a pixel portion and a driver transistor in a driver circuit portion, which results in less signal delay and the like due to wiring resistance, and can be used for a display device with large screen.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples are given as the vertical alignment mode. For example, a multi-domain vertical alignment (MVA) mode, a patterned vertical alignment (PVA) mode, and the like can be given. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a display device in which a light-emitting element is used as a display element is illustrated in FIG. 11. A light-emitting element 450 which is a display element is electrically connected to the transistor 350 provided in the pixel portion 302. Note that the structure of the light-emitting element 450 is a stacked structure of the conductive film 370b, an electroluminescent layer 452, and an upper electrode 454, however, the structure is not limited thereto. The structure of the light-emitting element 450 can be changed as appropriate depending on the direction in which light is extracted from the light-emitting element 450, or the like.

A partition wall 456 is made of an organic insulating material or an inorganic insulating material. It is particularly preferable that the partition wall 456 is formed using a photosensitive resin material. For example, in the case where the partition wall 456 is formed using a photosensitive resin material, by applying the photosensitive resin material over the planarization insulating film 368 and the conductive film 370b and irradiating a desired area thereof with light, an opening portion whose sidewall is formed as an inclined surface with continuous curvature is formed over part of the conductive film 370b.

The electroluminescent layer 452 may be formed using either a single layer or a plurality of layers stacked.

A protective film may be formed over the upper electrode 454 and the partition wall 456 in order to prevent oxygen, hydrogen, water, carbon dioxide, or the like from entering the light-emitting element 450. As the protective film, a silicon nitride film, a silicon nitride oxide film, or the like can be used. In addition, in a space which is formed with the first substrate 300, the second substrate 301, and the sealant 312, a filler 458 is provided and sealed. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 458, an ultraviolet curable resin or a thermosetting resin can be used as well as an inert gas such as nitrogen or argon. For example, polyvinyl chloride (PVC), an acrylic-based resin, a polyimide-based resin, an epoxy-based resin, a silicone-based resin, polyvinyl butyral (PVB), or ethylene vinyl acetate (EVA) can be used. For example, nitrogen is used for the filler 458.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Note that in FIG. 10 and FIG. 11, a flexible substrate as well as a glass substrate can be used as the first substrate 300 and the second substrate 301. For example, a light-transmitting plastic substrate or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

As described above, by using the transistors described in Embodiment 1 or Embodiment 2 and the signal line in Embodiment 2, a display device having a variety of functions can be provided.

This embodiment can be implemented in appropriate combination with the structures described in the other embodiments.

Embodiment 4

A semiconductor device disclosed in this specification can be applied to a variety of electronic devices (including game machines). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable digital assistant (PDA), a portable terminal (a smart phone, a tablet PC, and the like are included), an audio reproducing device, a large-sized game machine such as a pachinko machine, and the like. Examples of electronic devices each including the semiconductor device described in any of the above embodiments are described with reference to FIGS. 12A to 12F and FIGS. 13A to 13D.

Figure 12A:
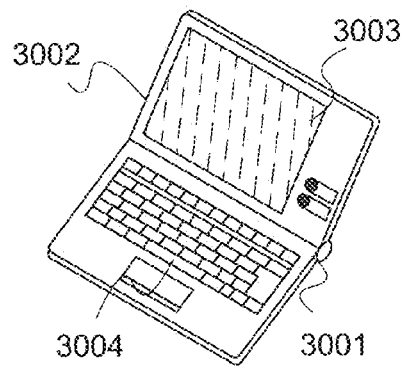
FIGS. 12A to 12F are examples of electronic devices each including a semiconductor device.

FIG. 12A illustrates a laptop personal computer which includes a main body 3001, a housing 3002, a display portion 3003, a keyboard 3004, and the like. The semiconductor device described in any of the above embodiments is applied to the display portion 3003, whereby a laptop personal computer with stable electric characteristics and little signal delay due to wiring resistance can be provided.

Figure 12B:
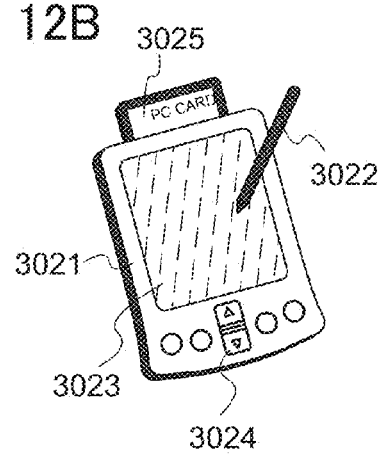

FIG. 12B is a portable digital assistant (PDA) including a display portion 3023, an external interface 3025, an operation button 3024, and the like in a main body 3021. A stylus 3022 is included as an accessory for operation. The semiconductor device described in any of the above embodiments is applied to the display portion 3023, whereby a portable digital assistant (PDA) with stable electric characteristics and little signal delay due to wiring resistance can be provided.

Figure 12C:
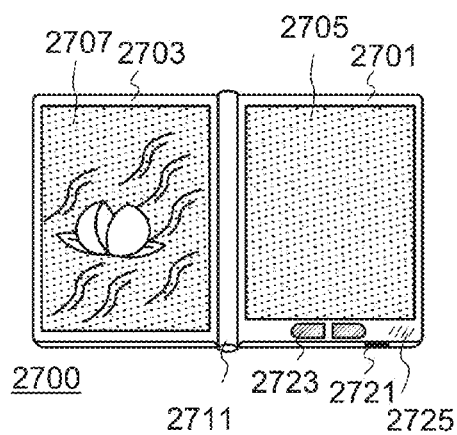

FIG. 12C illustrates an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed on different display portions, for example, the right display portion (the display portion 2705 in FIG. 12C) can display text and the left display portion (the display portion 2707 in FIG. 12C) can display images. The semiconductor device described in any of the above embodiments is applied to the display portion 2705 and the display portion 2707, whereby an e-book reader with stable electric characteristics and little signal delay due to wiring resistance can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 12C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 12D:
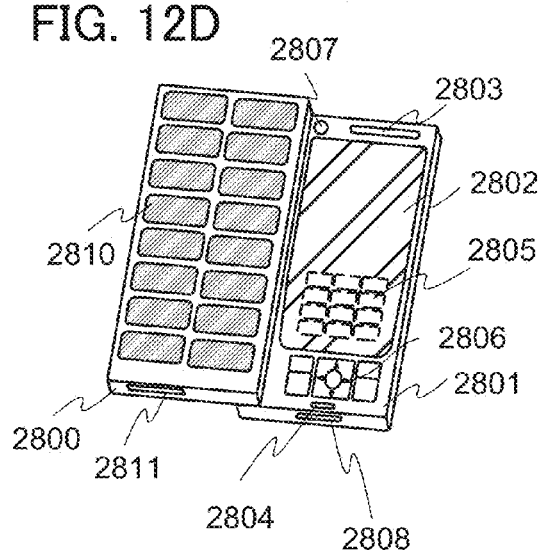

FIG. 12D is a mobile phone including two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. The semiconductor device described in any of the above embodiments is applied to the display panel 2802, a mobile phone with stable electric characteristics and little signal delay due to wiring resistance can be provided.

Further, the display panel 2802 is provided with a touch screen. A plurality of operation keys 2805 which is displayed is indicated by dashed lines in FIG. 12D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 12D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 12E:
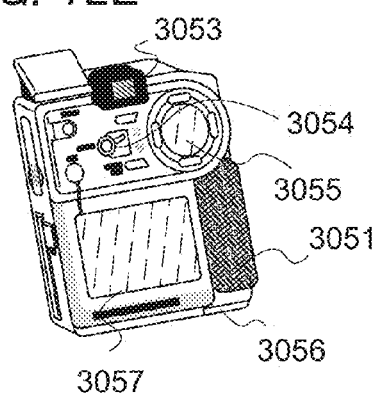

FIG. 12E is a digital video camera including a main body 3051, a display portion A 3057, an eyepiece 3053, an operation switch 3054, a display portion B 3055, a battery 3056, and the like. The semiconductor device described in any of the above embodiments is applied to the display portion A 3057 and the display portion B 3055, whereby a digital video camera with stable electric characteristics and little signal delay due to wiring resistance can be obtained.

Figure 12F:
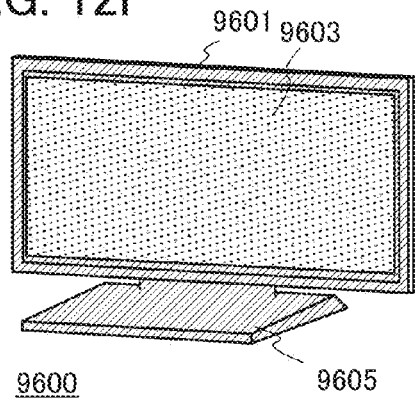

FIG. 12F shows an example of a television set. In the television set 9600, a display portion 9603 is incorporated in a housing 9601. The display portion 9603 can display images. Here, the housing 9601 is supported by a stand 9605. The semiconductor device described in any of the above embodiments is applied to the display portion 9603, whereby a television set with stable electric characteristics and little signal delay due to wiring resistance can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

FIGS. 13A to 13D illustrate examples of a tablet terminal. FIGS. 13A to 13C illustrate a tablet terminal 5000. FIG. 13D illustrates a tablet terminal 6000.

FIGS. 13A to 13C are a front view, a side view, and a rear view of the tablet terminal 5000, respectively. FIG. 13D is a front view of the tablet terminal 6000.

The tablet terminal 5000 includes a housing 5001, a display portion 5003, a power button 5005, a front camera 5007, a rear camera 5009, a first external connection terminal 5011, a second external connection terminal 5013, and the like.

In addition, the display portion 5003 is incorporated in the housing 5001 and can be used as a touch panel. For example, e-mailing or schedule management can be performed by touching an icon 5015 and the like on the display portion 5003. Further, the front camera 5007 is incorporated on the front side of the housing 5001, whereby an image on the user's side can be taken. The rear camera 5009 is incorporated in the rear side of the housing 5001, whereby an image on the opposite side of the user can be taken. Further, the housing 5001 includes the first external connection terminal 5011 and the second external connection terminal 5013. Sound can be output to an earphone or the like through the first external connection terminal 5011, and data can be moved through the second external connection terminal 5013, for example.

The tablet terminal 6000 in FIG. 13D includes a first housing 6001, a second housing 6003, a hinge portion 6005, a first display portion 6007, a second display portion 6009, a power button 6011, a first camera 6013, a second camera 6015, and the like.

The first display portion 6007 is incorporated in the first housing 6001. The second display portion 6009 is incorporated in the second housing 6003. For example, the first display portion 6007 and the second display portion 6009 are used as a display panel and a touch panel, respectively. By looking at a text icon 6017 displayed on the first display portion 6007 by touching the icon 6019 or a keyboard 6021 (a keyboard image, actually) displayed on the second display portion 6009, image selecting, text input, and the like can be made. Alternatively, the first display portion 6007 and the second display portion 6009 may be a touch panel and a display panel, respectively, or the first display portion 6007 and the second display portion 6009 may be touch panels.

The first housing 6001 and the second housing 6003 are connected to each other and open and close on the hinge portion 6005. With this structure, when the first display portion 6007 incorporated in the first housing 6001 and the second display portion 6009 incorporated in the second housing 6003 are faced each other in carrying the tablet terminal 6000, the surfaces of the first display portion 6007 and the second display portion 6009 (e.g., plastic substrates) can be protected, which is preferable.

Alternatively, the first housing 6001 and the second housing 6003 may be separated by the hinge portion 6005 (convertible type). Thus, the application range of the tablet terminal 6000 can be extended, and for example, the first housing 6001 is used in a vertical orientation and the second housing 6003 is used in a horizontal orientation.

Further, the first camera 6013 and the second camera 6015 can take 3D images.

The tablet terminal 5000 and the tablet terminal 6000 may send and receive data wirelessly. For example, through wireless internet connection, desired data can be purchased and downloaded.

The tablet terminals 5000 and 6000 can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs). A detector such as a photodetector capable of optimizing display luminance in accordance with the amount of outside light or a sensor for detecting inclination, like a gyroscope or an acceleration sensor, can be included.

The semiconductor device described in any of the above embodiments is applied to the display portion 5003 of the tablet terminal 5000, the first display portion 6007 of the tablet terminal 6000, and/or the second display portion 6009, the tablet terminal with stable electric characteristics and little signal delay due to wiring resistance can be provided.

This embodiment can be implemented in appropriate combination with the structures described in the other embodiments.

This application is based on Japanese Patent Application serial no. 2012-026624 filed with Japan Patent Office on Feb. 9, 2012, the entire contents of which are hereby incorporated by reference.

What is claimed is:

1. A method for manufacturing a semiconductor device, comprising the steps of:
    forming a gate electrode;
    forming a gate insulating film over the gate electrode;
    forming an oxide semiconductor film over the gate electrode with the gate insulating film interposed between the gate electrode and the oxide semiconductor film; and
    forming a source electrode and a drain electrode over the oxide semiconductor film,
    wherein the steps of forming the source electrode and the drain electrode comprise the steps of:
    forming a first metal film;
    forming a second metal film over the first metal film;
    performing a first photolithography process on the second metal film and partly removing the second metal film by first etching;
    forming a third metal film over the first metal film and the second metal film to cover the second metal film; and
    performing a second photolithography process on the third metal film and partly removing the first metal film and the third metal film by second etching, and
    wherein the second etching partly removes the first metal film and the third metal film at an outer side of end portions of the second metal film which is removed by the first etching.

2. The method for manufacturing a semiconductor device, according to claim 1, further comprising the steps of:
    forming a first insulating film over the source electrode and the drain electrode;
    introducing oxygen into the first insulating film;
    forming a second insulating film over the first insulating film;
    forming an aluminum film over the second insulating film;
    introducing oxygen into the aluminum film to form an aluminum oxide film; and
    forming a planarization insulating film over the aluminum oxide film.

3. The method for manufacturing a semiconductor device, according to claim 1,
    wherein each of the first metal film and the third metal film is a metal film or a metal nitride film containing one or more elements selected from tungsten, tantalum, titanium, and molybdenum.

4. The method for manufacturing a semiconductor device, according to claim 1,
    wherein the second metal film contains a copper element.

5. The method for manufacturing a semiconductor device, according to claim 1,
    wherein the first etching is a wet etching method.

6. The method for manufacturing a semiconductor device, according to claim 1,
    wherein the second etching is a dry etching method.

7. The method for manufacturing a semiconductor device, according to claim 2,
    wherein the step of introducing oxygen into the first insulating film is performed by plasma treatment using oxygen gas.

8. A method for manufacturing a semiconductor device, comprising the steps of:
forming a gate electrode;
forming a gate insulating film over the gate electrode;
forming an oxide semiconductor film over the gate electrode with the gate insulating film interposed between the gate electrode and the oxide semiconductor film; and
forming a source electrode and a drain electrode over the oxide semiconductor film,
wherein the steps of forming the source electrode and the drain electrode comprise the steps of:
forming a first metal film;
forming a second metal film over the first metal film;
performing a first photolithography process on the second metal film and partly removing the second metal film by first etching;
forming a third metal film over the first metal film and the second metal film to cover the second metal film; and
performing a second photolithography process on the third metal film and partly removing the first metal film and the third metal film by second etching,
wherein an end portion of the first metal film and an end portion of the third metal film subjected to the second etching are extended to outside of an end portion of the second metal film subjected to the first etching,
wherein the end portion of the first metal film and the end portion of the third metal film subjected to the second etching are in contact with each other, and
wherein the second metal film includes copper.

9. The method for manufacturing a semiconductor device, according to claim 8, further comprising the steps of:
forming a first insulating film over the source electrode and the drain electrode;
introducing oxygen into the first insulating film;
forming a second insulating film over the first insulating film;
forming an aluminum film over the second insulating film;
introducing oxygen into the aluminum film to form an aluminum oxide film; and
forming a planarization insulating film over the aluminum oxide film.

10. The method for manufacturing a semiconductor device, according to claim 8,
wherein each of the first metal film and the third metal film is a metal film or a metal nitride film containing one or more elements selected from tungsten, tantalum, titanium, and molybdenum.

11. The method for manufacturing a semiconductor device, according to claim 8,
wherein the first etching is a wet etching method.

12. The method for manufacturing a semiconductor device, according to claim 8,
wherein the second etching is a dry etching method.

13. The method for manufacturing a semiconductor device, according to claim 9,
wherein the step of introducing oxygen into the aluminum film is performed by plasma treatment using oxygen gas.

14. A method for manufacturing a semiconductor device, comprising the steps of:
forming a gate electrode;
forming a gate insulating film over the gate electrode;
forming an oxide semiconductor film over the gate electrode with the gate insulating film interposed between the gate electrode and the oxide semiconductor film;
forming a source electrode and a drain electrode over the oxide semiconductor film;
forming a first insulating film over the oxide semiconductor film after forming the source electrode and the drain electrode; and
introducing oxygen into the first insulating film,
wherein the steps of forming the source electrode and the drain electrode comprise the steps of:
forming a first metal film;
forming a second metal film over the first metal film;
performing a first photolithography process on the second metal film and partly removing the second metal film by first etching;
forming a third metal film over the first metal film and the second metal film to cover the second metal film; and
performing a second photolithography process on the third metal film and partly removing the first metal film and the third metal film by second etching,
wherein an end portion of the first metal film and an end portion of the third metal film subjected to the second etching are extended to outside of an end portion of the second metal film subjected to the first etching,
wherein the end portion of the first metal film and the end portion of the third metal film subjected to the second etching are in contact with each other, and
wherein the second metal film includes copper.

15. The method for manufacturing a semiconductor device, according to claim 14, further comprising the steps of:
forming a second insulating film over the first insulating film;
forming an aluminum film over the second insulating film;
introducing oxygen into the aluminum film to form an aluminum oxide film; and
forming a planarization insulating film over the aluminum oxide film.

16. The method for manufacturing a semiconductor device, according to claim 14,
wherein each of the first metal film and the third metal film is a metal film or a metal nitride film containing one or more elements selected from tungsten, tantalum, titanium, and molybdenum.

17. The method for manufacturing a semiconductor device, according to claim 14,
wherein the first etching is a wet etching method.

18. The method for manufacturing a semiconductor device, according to claim 14,
wherein the second etching is a dry etching method.

19. The method for manufacturing a semiconductor device, according to claim 14,
wherein the step of introducing oxygen into the first insulating film is performed by plasma treatment using oxygen gas.

* * * * *